(12) United States Patent
Akutsu

(10) Patent No.: US 9,741,736 B2
(45) Date of Patent: Aug. 22, 2017

(54) SEMICONDUCTOR MEMORY DEVICE

(71) Applicant: Kabushiki Kaisha Toshiba, Minato-ku (JP)

(72) Inventor: Yoshihiro Akutsu, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/069,432

(22) Filed: Mar. 14, 2016

(65) Prior Publication Data

US 2017/0077025 A1    Mar. 16, 2017

Related U.S. Application Data

(60) Provisional application No. 62/216,882, filed on Sep. 10, 2015.

(51) Int. Cl.
| | |
|---|---|
| *H01L 29/80* | (2006.01) |
| *H01L 29/76* | (2006.01) |
| *H01L 21/00* | (2006.01) |
| *H01L 21/8238* | (2006.01) |
| *H01L 27/11582* | (2017.01) |
| *H01L 27/1157* | (2017.01) |

(52) U.S. Cl.
CPC .... *H01L 27/11582* (2013.01); *H01L 27/1157* (2013.01)

(58) Field of Classification Search
CPC ......... H01L 27/11504; H01L 27/11514; H01L 27/11521; H01L 27/22565; H01L 27/11568; H01L 29/06; H01L 29/0684; H01L 29/41; H01L 29/8083; H01L 29/8122
USPC ........ 257/263, 302, 328; 438/156, 212, 173, 438/268
See application file for complete search history.

(56) References Cited

U.S. PATENT DOCUMENTS

| | | | |
|---|---|---|---|
| 8,115,245 B2 | 2/2012 | Yoshimizu et al. | |
| 8,546,786 B2 | 10/2013 | Yoshimizu et al. | |
| 8,633,535 B2* | 1/2014 | Matsuo | H01L 27/11565 257/324 |
| 2015/0340377 A1* | 11/2015 | Lee | H01L 27/11582 257/314 |

* cited by examiner

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor memory device includes a substrate, a stacked body, a plurality of columnar portions, and a first interconnect. When an imaginary first straight line extending in a second direction crossing a first direction is set, the plurality of columnar portions are divided into first sets of n (n is an integer number not less than 3 and not more than 32) columnar portions with center axes alternately disposed on both sides of the first straight line along the second direction and second sets of n columnar portions having position relationships of inversion of the first sets with respect to the first straight line, and the first sets and the second sets are alternately arranged.

18 Claims, 26 Drawing Sheets

SEMICONDUCTOR MEMORY DEVICE

CROSS-REFERENCE TO RELATED APPLICATIONS

Reference is hereby made to co-pending U.S. patent application Ser. No. 13/112,345, filed on May 20, 2011, the entire disclosure of which is incorporated herein by reference.

This application is based upon and claims the benefit of priority from U.S. Provisional Patent Application 62/216,882, filed on Sep. 10, 2015; the entire contents of which are incorporated herein by reference.

FIELD

Embodiments described herein relate generally to a semiconductor memory device.

BACKGROUND

A semiconductor memory device having a three-dimensional structure has been proposed, in which memory holes are formed in a stacked body including a plurality of electrode layers stacked via an insulating layer, and a silicon body serving as a channel is provided on a side wall of the memory hole via a charge storage layer. The electrode layers function as control gates in memory cells, and integration of the semiconductor memory device is increased by reduction of the sizes of the memory holes and increase of the number of the memory holes. However, with shrink of the memory cells, interconnects connected via the memory holes may become dense and a defect may occur in memory operation.

DETAILED DESCRIPTION

Figure 1:
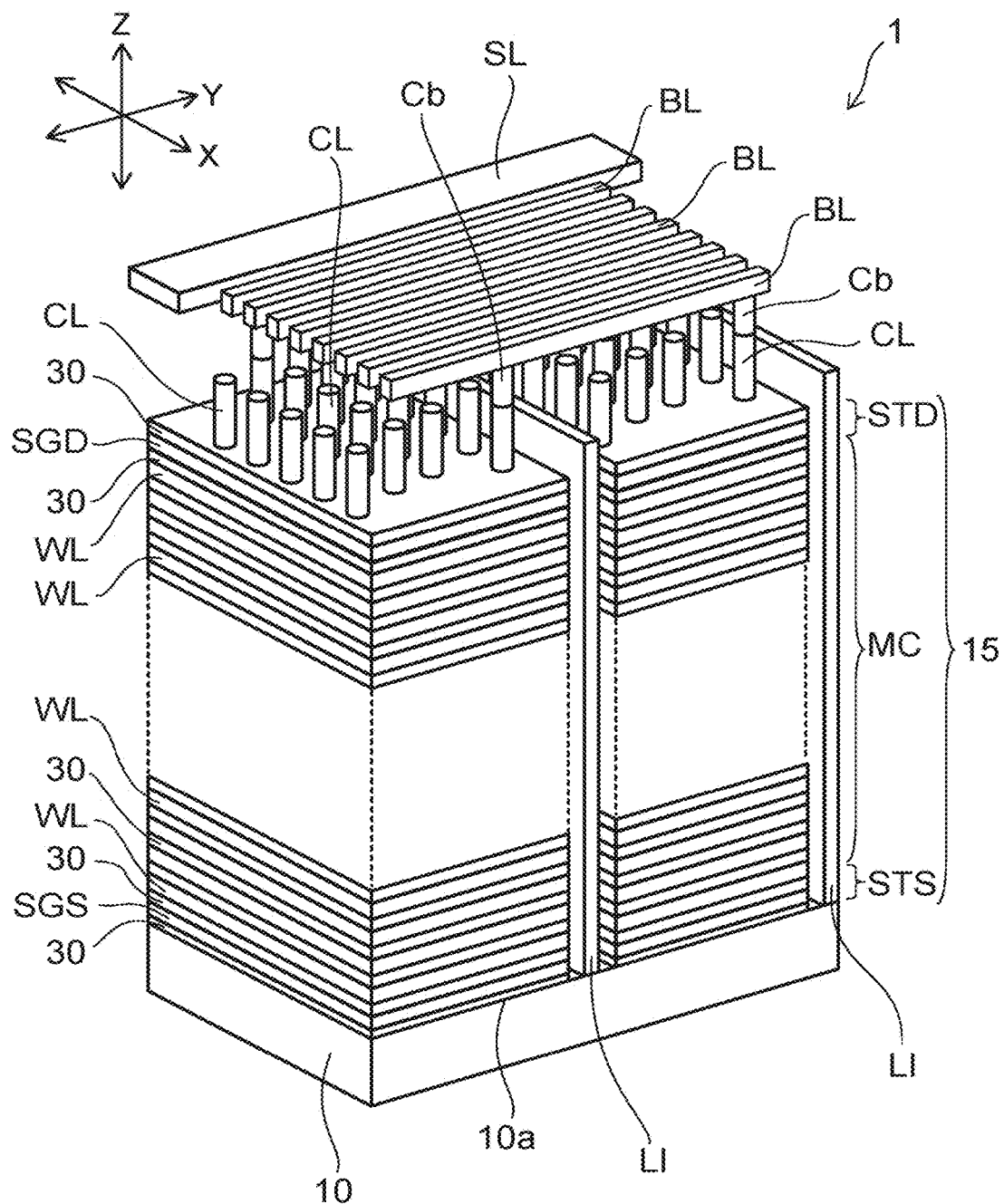
FIG. 1 is a schematic perspective view of a semiconductor memory device of a first embodiment.

According to one embodiment, a semiconductor memory device includes a substrate, a stacked body, a plurality of columnar portions, and a first interconnect. The stacked body is provided on the substrate. The stacked body includes a plurality of electrode layers. The plurality of electrode layers are respectively separately stacked. The plurality of columnar portions are provided within the stacked body. The plurality of columnar portions extend in a stacking direction of the stacked body. The first interconnect is provided on the plurality of columnar portions. The first interconnect extends in a first direction. When an imaginary first straight line extending in a second direction crossing the first direction is set, the plurality of columnar portions are divided into first sets of n (n is an integer number not less than 3 and not more than 32) columnar portions with center axes alternately disposed on both sides of the first straight line along the second direction and second sets of n columnar portions having position relationships of inversion of the first sets with respect to the first straight line, and the first sets and the second sets are alternately arranged.

Embodiments will now be described with reference to the drawings. The same components in the drawings are marked with the same reference numerals.

A semiconductor memory device having a three-dimensional structure will be described as an example.

First Embodiment

FIG. 1 is a schematic perspective view of a semiconductor memory device of a first embodiment.

Figure 2:
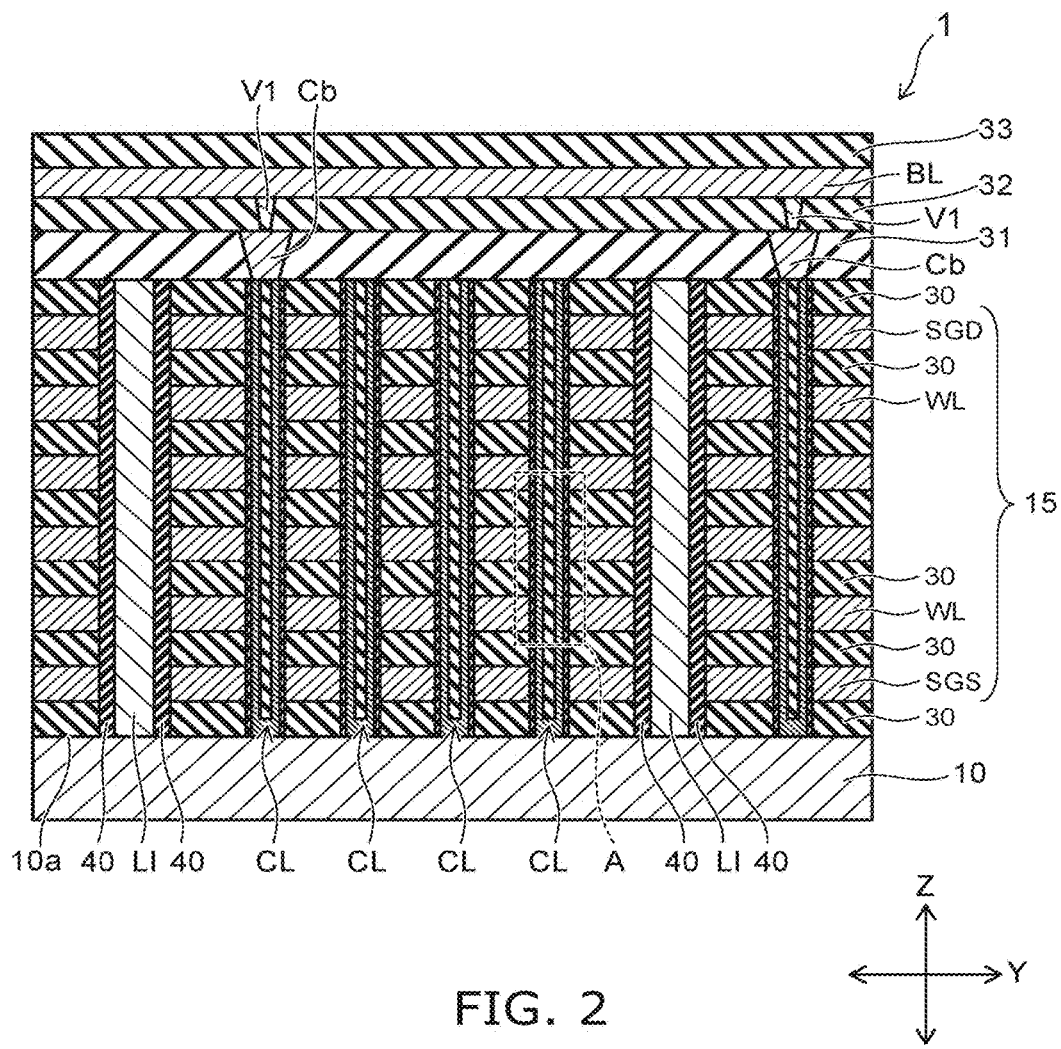
FIG. 2 is a schematic sectional view of the semiconductor memory device of the first embodiment.
Figure 3:
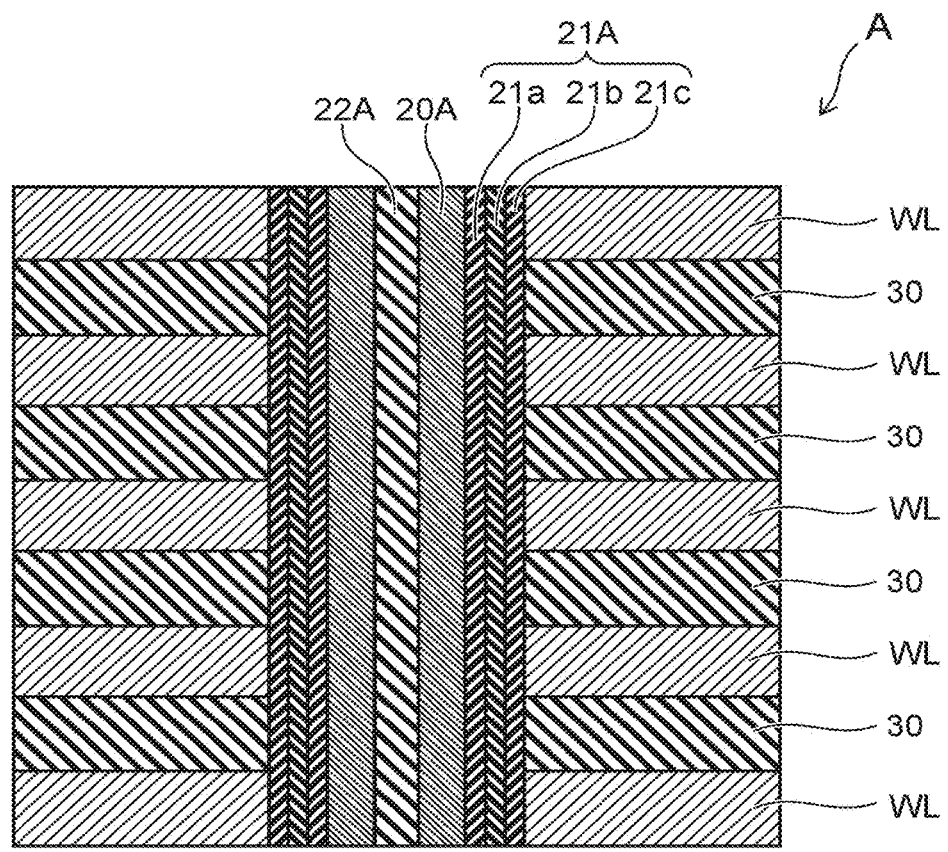
FIG. 3 is an enlarged view of a region A in FIG. 2.

FIG. 2 is a schematic sectional view of the semiconductor memory device of the first embodiment. FIG. 3 is an enlarged view of a region A in FIG. 2.

FIG. 1 shows a memory cell array of a semiconductor memory device 1. FIG. 2 and FIG. 3 show the sectional views of the memory cell array. In FIG. 1, an insulating layer 31, an insulating layer 32, an insulating layer 33, and contact portions V1 are not shown.

In FIG. 1, two directions parallel to an upper surface 10a of a substrate 10 and orthogonal to each other are an X-direction and a Y-direction, and a direction orthogonal to both the X-direction and the Y-direction is a Z-direction. The Z-direction is a stacking direction.

As shown in FIG. 1 and FIG. 2, a stacked body 15 is provided on the substrate 10 via an insulating layer 30. The stacked body 15 has a plurality of electrode layers WL, a plurality of insulating layers 30, a source-side select gate SGS, and a drain-side select gate SGD. The plurality of electrode layers WL are respectively separately stacked, and the plurality of insulating layers 30 are provided between the plurality of electrode layers WL. For instance, the plurality of electrode layers WL and the plurality of insulating layers 30 are alternately stacked one by one. The number of electrode layers WL shown in the drawings is just an example, and the number of electrode layers WL may be arbitrary.

The source-side select gate SGS is provided in the lowermost layer of the stacked body 15. The drain-side select gate SGD is provided in the uppermost layer of the stacked body 15. On the stacked body 15, the insulating layer 30 is provided.

The plurality of electrode layers WL are made of one of e.g. metal, metal silicide, and polysilicon. The source-side select gate SGS and the drain-side select gate SGD may contain the same material as that of the above described plurality of electrode layers WL or a different material. For the insulating layers 30, the insulating layer 31, the insulating layer 32, and the insulating layer 33, e.g. insulating layers containing silicon oxide are used.

Within the stacked body 15, columnar portions CL extending in the Z-direction are provided. The columnar portions CL are formed in e.g. circular cylinder shapes or elliptic cylinder shapes. The details of disposition of the columnar portions CL will be described later.

As shown in FIG. 3, the columnar portion CL has a channel body 20A (semiconductor portion), a memory film 21A, and a core insulating portion 22A. The channel body 20A is e.g. a silicon film.

The memory film 21A is provided between the stacked body 15 and the channel body 20A. In the memory film 21A, a tunnel insulating layer 21a, a charge storage layer 21b, and a block insulating layer 21c are stacked in the order from the side of the channel body 20A. The tunnel insulating layer 21a is a layer that normally exhibits an insulation property, but allows a tunnel current to flow when a predetermined voltage within a range of a drive voltage of the semiconductor memory device 1 is applied thereto. The charge storage layer 21b is a layer that stores charge and e.g. a layer containing silicon nitride is used. The block insulating layer 21c is a layer that does not substantially allow a current to flow even when a voltage is applied within the range of the drive voltage of the semiconductor memory device 1 and an oxide layer formed of a high-dielectric constant material e.g. silicon oxide, aluminum oxide, or hafnium oxide or a multilayer film in which these oxide layers are stacked.

The memory film 21A may be formed to have a floating gate. For instance, the memory film 21A may be formed by digging the electrode layers WL and burying a floating gate inside.

The core insulating portion 22A is provided inside of the channel body 20A. The core insulating portion 22A may include e.g. a silicon oxide film and an air gap. The core insulating portion 22A is not necessarily provided inside of the channel body 20A.

In the stacked body 15, interconnect portions LI extending in the X-direction and the Z-direction within the stacked body 15 are provided. The interconnect portions LI are electrically connected via contacts (not shown) to a source line SL thereon. The interconnect portions LI are formed by e.g. a metal material of tungsten or the like. The interconnect portion LI has a plate-like portion in parallel to the XZ-plane. For instance, regarding the interconnect portions LI, a plurality of plate-like portions may be mutually connected. For instance, in FIG. 1, the two plate-like portions of the interconnect portions LI may be connected to each other.

The insulating film 40 is provided on the side wall of the interconnect portion LI. The insulating film 40 extends in the X-direction and the Z-direction like the interconnect portion LI. As the insulating film 40, e.g. a film containing silicon oxide is used. The interconnect portion LI electrically connects to the columnar portions CL in the lower surface thereof.

A contact portion Cb is provided on the upper end of the channel body 20A. Further, the contact portion V1 is provided on the contact portion Cb. The contact portion V1 is thinner than the contact portion Cb. The contact portion Cb and the contact portion V1 are e.g. contact plugs and formed by stacking metal-containing layers of tungsten layers and titanium nitride layers or the like.

On the contact portions V1, a plurality of bit lines BL are provided. The plurality of bit lines BL are respectively separated in the X-direction and extend in the Y-direction. The plurality of bit lines BL are formed by e.g. metal films. The upper end of the channel body 20A is connected to the bit line BL via the contact portion Cb and the contact portion V1.

The plurality of columnar portions CL (channel bodies 20A) selected one from each of the respective regions separated in the Y-direction are connected to one common bit line BL. Each bit line BL is connected to one columnar portion CL provided in the stacked body 15 divided into predetermined blocks via one contact portion V1 and one contact portion Cb. Here, "block" corresponds to a part between the adjacent interconnect portions LI. Each bit line BL extends in the Y-direction over a plurality of blocks and is connected to the one columnar portion CL with respect to each block. Note that FIG. 2 shows a state in which one bit line BL connects to one columnar portion CL within the block via the contact portion V1 and the contact portion Cb. The details of the connection between the columnar portions CL and the bit lines BL with the disposition of the columnar portions CL will be described later.

A drain-side select transistor STD is formed on the upper ends of the columnar portions CL and a source-side select transistor STS is formed on the lower ends. Memory cells MC, the drain-side select transistor STD, and the source-side select transistor STS form a vertical transistor in which a current flows in the stacking direction of the stacked body 15 (Z-direction).

The above described respective select gates SGD, SGS function as gate electrodes (control gates) of the respective select transistors STD, STS. The memory films 21A that function as gate insulating films of the respective select transistors STD, STS are provided between the respective select gates SGD, SGS and the channel body 20A.

The plurality of memory cells MC using the respective electrode layers WL as control gates are provided between the drain-side select transistor STD and the source-side select transistor STS.

Those plurality of memory cells MC, the drain-side select transistor STD, and the source-side select transistor STS are series-connected through the channel body 20A and form one memory string. The memory strings are disposed in a plane direction parallel to the X-Y plane, e.g. in a staggered arrangement, and thereby, the plurality of memory cells MC are three-dimensionally provided in the X-direction, the Y-direction, and the Z-direction.

It is possible that the semiconductor memory device 1 of the embodiment electrically freely performs erasing and writing of data and retains memory contents even when power is turned off.

As below, the disposition of the columnar portions CL will be described.

In the following drawings, there are parts in which the adjacent columnar portions CL are in contact, however, the columnar portions CL may be disposed to have margins with respect to the outsides of the columnar portions CL.

Figure 4A:
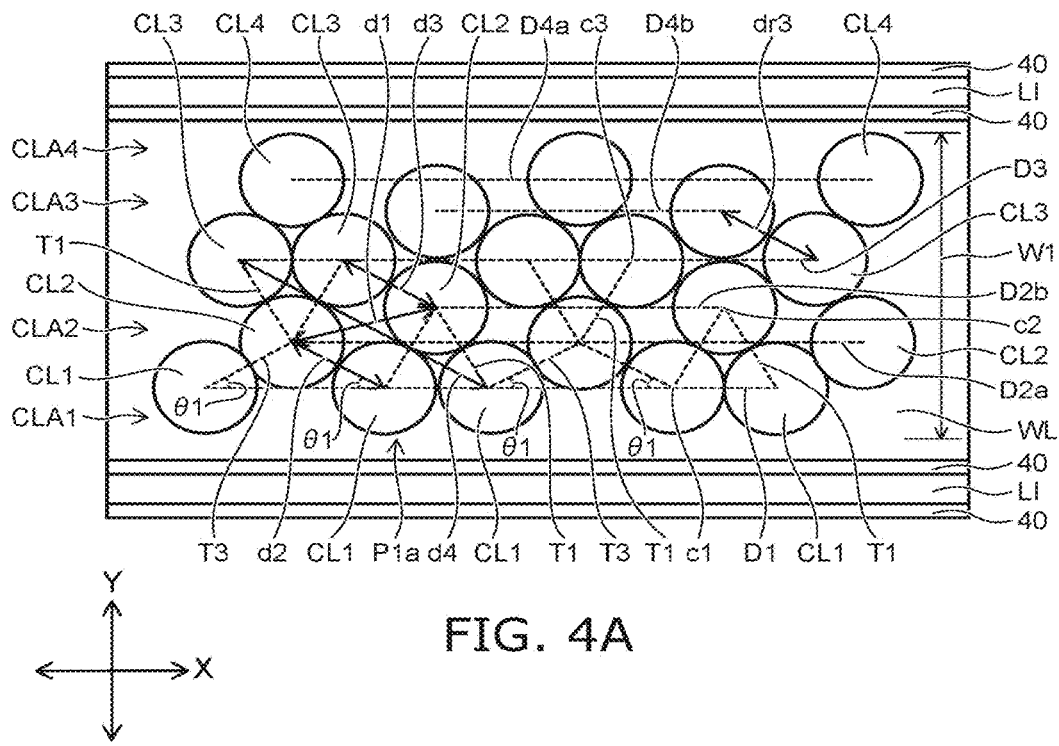
FIG. 4A is a schematic plan view of the semiconductor memory device of the first embodiment.

FIG. 4A is a schematic plan view of the semiconductor memory device of the first embodiment.

Figure 4B:
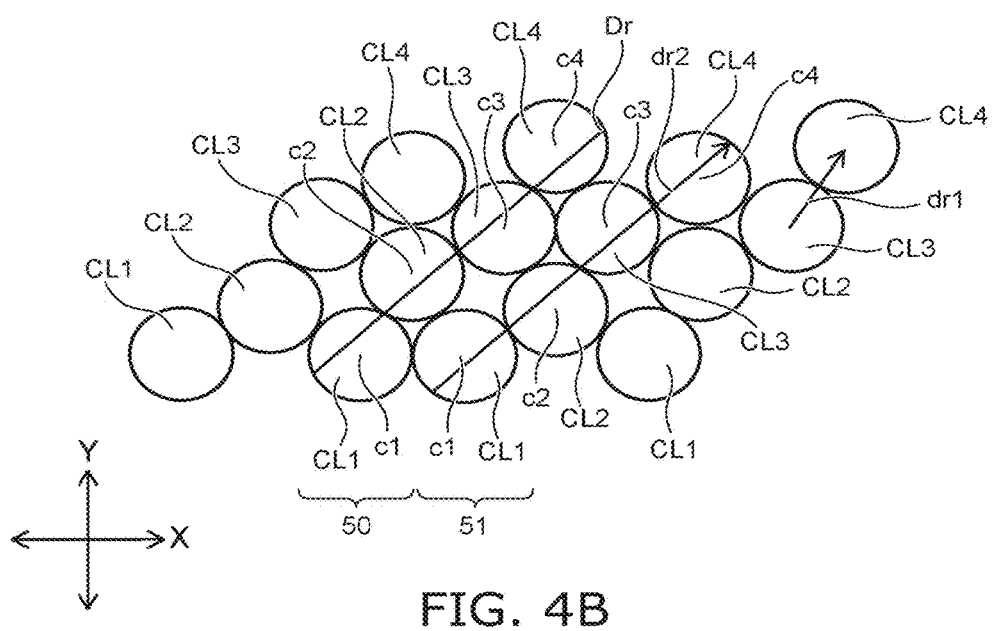
FIG. 4B shows a part of FIG. 4A.

FIG. 4B shows a part of FIG. 4A.

Figure 5:
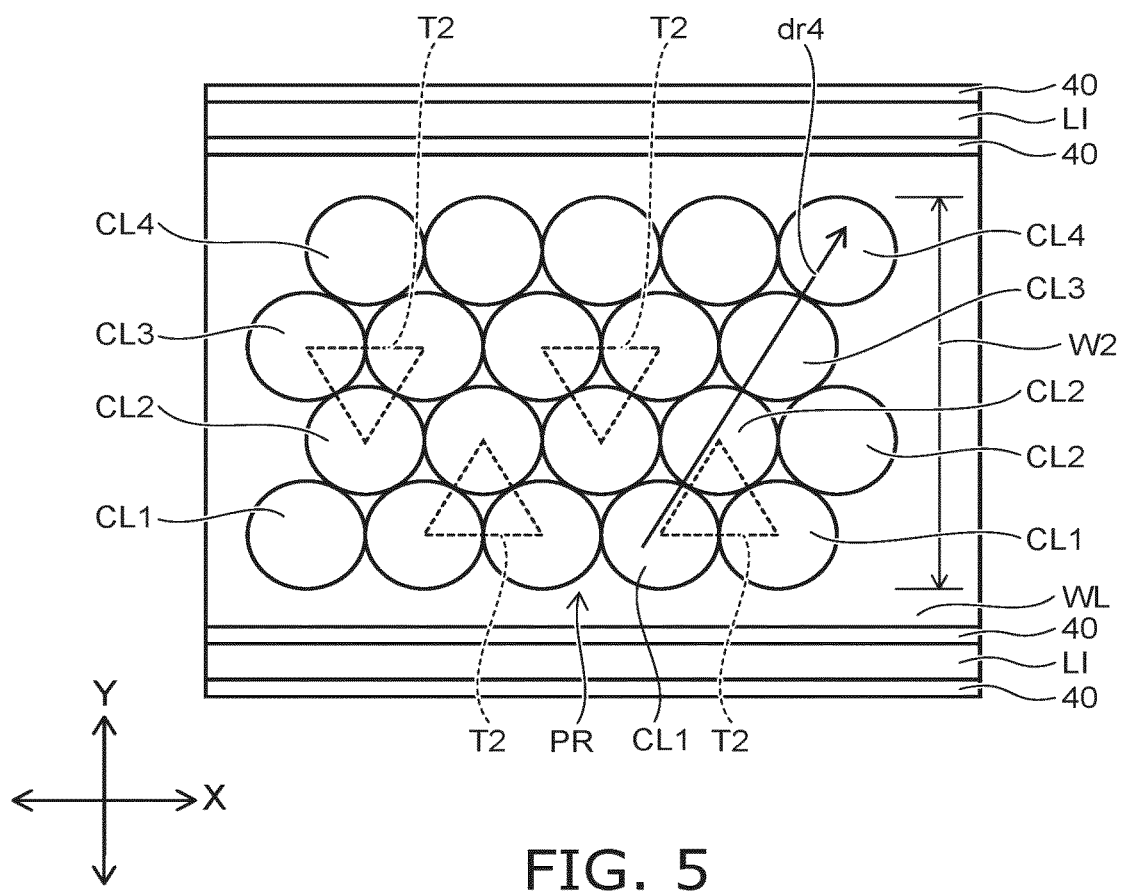
FIG. 5 is a reference diagram showing a disposition of columnar portions.

FIG. 5 is a reference diagram showing a disposition of the columnar portions.

Figure 6:
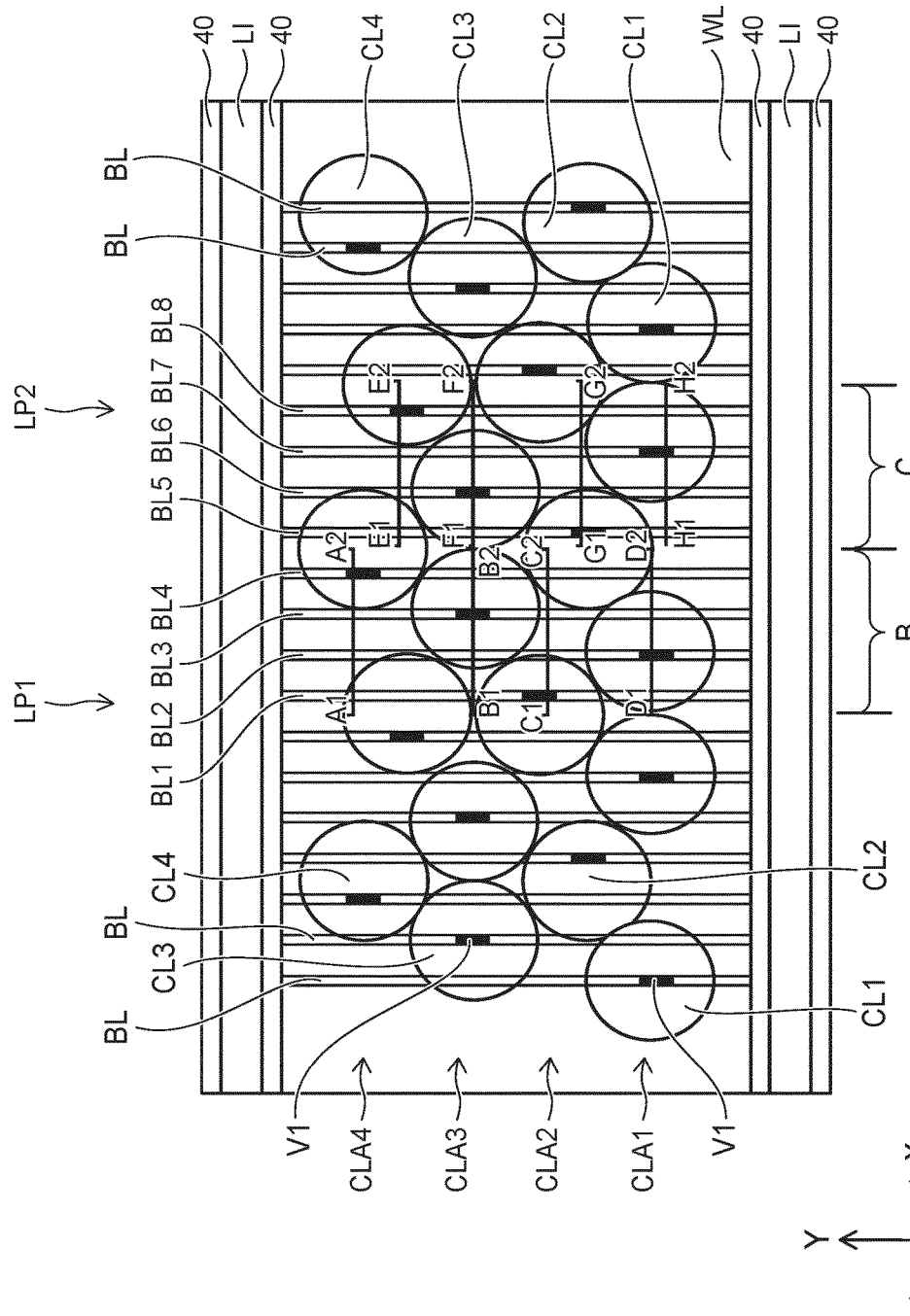
FIG. 6 is a schematic plan view of the semiconductor memory device of the first embodiment.
Figure 7A:
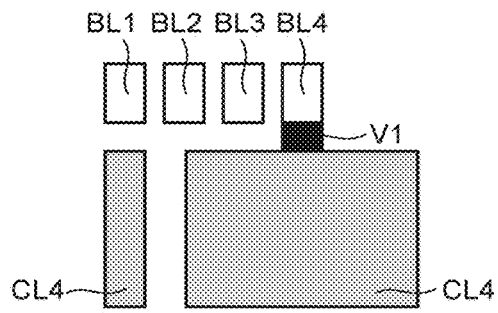
FIG. 7A to FIG. 7D are sectional views along line A1-A2, line B1-B2, line C1-C2, and line D1-D2 in FIG. 6.
Figure 7B:
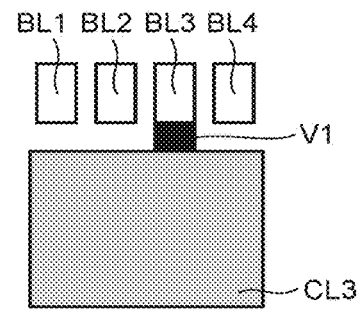
Figure 7C:
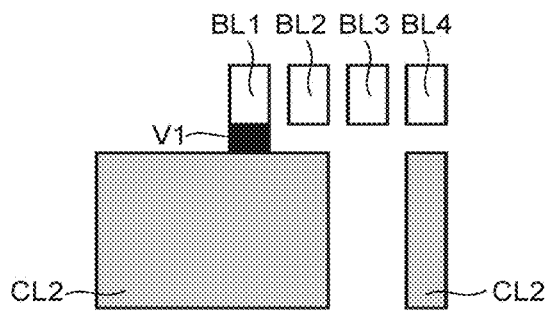
Figure 7D:
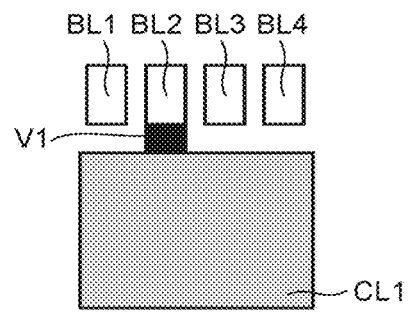
Figure 8A:
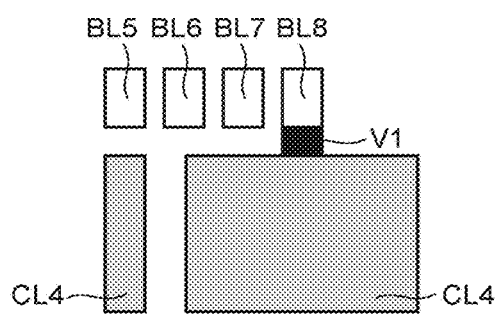
FIG. 8A to FIG. 8D are sectional views along line E1-E2, line F1-F2, line G1-G2, and line H1-H2 in FIG. 6.
Figure 8B:
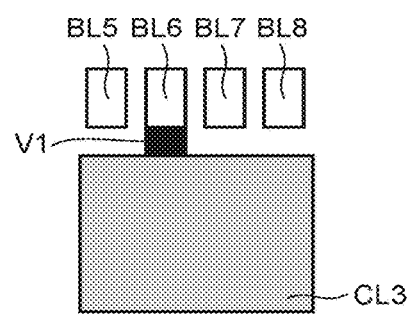
Figure 8C:
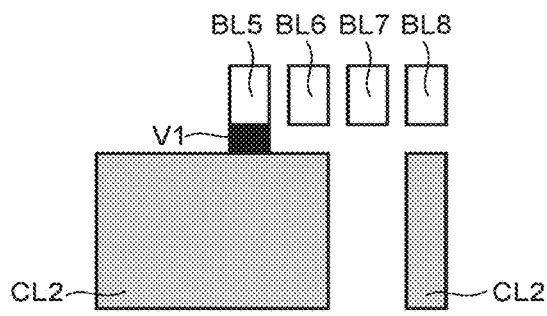
Figure 8D:
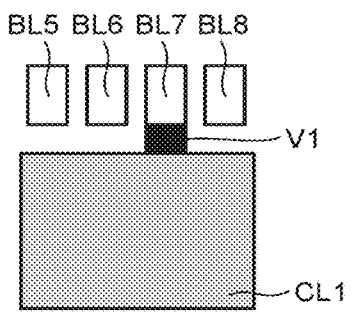

FIG. 6 is a schematic plan view of the semiconductor memory device of the first embodiment.

FIG. 7A to FIG. 7D are sectional views along line A1-A2, line B1-B2, line C1-C2, and line D1-D2 in FIG. 6.

FIG. 8A to FIG. 8D are sectional views along line E1-E2, line F1-F2, line G1-G2, and line H1-H2 in FIG. 6.

FIG. 4A is a top view of a memory cell array and shows a disposition of the columnar portions CL1 to CL4 piercing one electrode layer WL. FIG. 4B shows a part of the columnar portions CL1 to CL4 shown in FIG. 4A. FIG. 5 is a top view of the memory cell array and the reference diagram showing a disposition of the columnar portions CL1 to CL4 of the electrode layer WL. FIG. 6 is a top view of the memory cell array showing connection between the respective columnar portions CL1 to CL4 to the bit lines BL. FIG. 7A to FIG. 7D are sectional views showing connection between the respective columnar portions CL1 to CL4 to the bit lines BL1 to BL4. FIG. 8A to FIG. 8D are sectional views showing connection between the respective columnar portions CL1 to CL4 to the bit lines BL5 to BL8.

As shown in FIG. 4A, a first row CLA1 as a row of the plurality of columnar portions CL1, a second row CLA2 as a row of the plurality of columnar portions CL2, a third row CLA3 as a row of the plurality of columnar portions CL3, and a fourth row CLA4 as a row of the plurality of columnar portions CL4 are formed in the electrode layer WL. As below, the case where the number of rows of the columnar portions is four will be described, and e.g. n (n is an integer number, 3≤n≤18) rows of the columnar portions CL may be formed.

When straight lines along the X-direction are formed in the electrode layer WL, the respective columnar portions CL1 of the first row CLA1 are located on a straight line D1. The respective odd-numbered columnar portions CL2 of the second row CLA2 are located on a straight line D2a. The respective even-numbered columnar portions CL2 of the second row CLA2 are located on a straight line D2b. The respective columnar portions CL3 of the third row CLA3 are located on a straight line D3. The respective odd-numbered columnar portions CL4 of the fourth row CLA4 are located on a straight line D4a. The respective even-numbered columnar portions CL4 of the fourth row CLA4 are located on a straight line D4b. For instance, the respective columnar portions CL1, CL3 are arranged on the straight lines along the X-direction and the respective columnar portions CL2, CL4 are arranged in a zig-zag pattern in the X-direction. Note that the columnar portions CL1 to CL4 of the first row CLA1 to CLA4 are sequentially disposed from the −X-direction to the +X-direction.

The columnar portions CL1 to CL4 are disposed in the zig-zag pattern in the direction crossing the X-direction and the Y-direction. For instance, in FIG. 4B, suppose that the direction crossing the X-direction and the Y-direction is a direction dr1, the columnar portions CL1 to CL4 are not disposed along the direction dr1. Further, when a straight line Dr along a direction dr2 crossing the X-direction and the Y-direction is formed, the columnar portions CL1 to CL4 may be divided in sets 50 of the columnar portions CL with the centers of the columnar portions CL alternately disposed on both sides of the straight line Dr and sets 51 of the columnar portions CL having position relationships of inversion of the sets 50 with respect to the straight line Dr. Namely, the sets 50 include the columnar portions CL1 to CL4 with centers c1 to c4 of the columnar portions CL1 to CL4 alternately disposed on both sides of the straight line Dr, and the sets 51 include the columnar portions CL1 to CL4 having the position relationships of inversion of the sets 50 with respect to the straight line Dr. In the sets 50 and the sets 51, the center axes of the respective columnar portions CL1 to CL4 are alternately disposed on both sides of the straight line Dr. The sets 50 and the sets 51 are alternately arranged in the X-direction.

The columnar portions CL1 to CL3 are disposed in a pattern in which a plurality of equilateral triangles T1 are combined in a staggered manner in the X-direction. By the columnar portions CL1 to CL3, a disposition P1a is formed such that the plurality of equilateral triangles T1 are combined in the staggered manner in the X-direction. In the adjacent equilateral triangles T1, one equilateral triangle T1 is an equilateral triangle formed by rotation of the other equilateral triangle T1 to 180 degrees. In the adjacent equilateral triangles T1, one equilateral triangle T1 is an equilateral triangle formed by vertical inversion of the other equilateral triangle T1. The equilateral triangle T1 is formed by e.g. a straight line connecting the center c1 of the columnar portion CL1 and the center c2 of the columnar portion CL2. The equilateral triangle T1 is formed by e.g. a straight line connecting the center c2 of the columnar portion CL2 and the center c3 of the columnar portion CL3.

In the disposition P1a, for instance, a distance d1 between the columnar portions CL2 is longer than a distance d2 between the columnar portion CL1 and the columnar portion CL2 and a distance d3 between the columnar portion CL1 and the columnar portion CL3. Further, the distance d1 between the columnar portions CL2 is shorter than a distance d4 between the columnar portion CL1 and the columnar portion CL3. The distances d1 to d4 correspond to distances determined by the straight lines connecting the centers of the columnar portions CL. Furthermore, in the disposition P1a, for instance, the columnar portion CL1 and the columnar portion CL2 separated from each other at the distance d2, the columnar portion CL2 and the columnar portion CL3 separated from each other at the distance d3, and the columnar portion CL1 and the columnar portion CL3 separated from each other at the distance d4 are disposed along the same direction (direction dr3).

As shown in FIG. 5, when the columnar portions CL1 to CL4 are arranged with the highest density, the densest arrangement directions are three directions of the Y-direction and directions inclined to ±30° with respect to the Y-direction. The columnar portions CL1 to CL4 are periodically arranged in an equilateral triangle grid pattern. The columnar portions CL1 to CL4 are disposed along a direction crossing the X-direction and the Y-direction. For instance, suppose that the direction crossing the X-direction and the Y-direction is a direction dr4, the columnar portions CL1 to CL4 are disposed along the direction dr4. Further, by the columnar portions CL1 to CL3, a disposition PR is formed such that a plurality of equilateral triangles T2 are combined in a staggered manner in the X-direction.

The disposition P1a in FIG. 4A is a disposition in which, in the adjacent equilateral triangles T2 within the disposition PR in FIG. 5, the distance in the X-direction is made larger and the distance in the Y-direction is made smaller. Namely, the disposition P1a in FIG. 4A is a disposition in which the positions of the adjacent equilateral triangles T2 within the disposition PR in FIG. 5 are shifted in the X-direction and the Y-direction. A width W1 between the columnar portion CL1 and the columnar portion CL4 in FIG. 4A (in the example of FIG. 4A, the odd-numbered columnar portion CL4) in the Y-direction is smaller than a width W2 between the columnar portion CL1 and the columnar portion CL4 in FIG. 5 in the Y-direction. By the disposition P1a, it is possible to shorten the distances in the Y-direction in disposing the columnar portions CL1 to CL4.

The columnar portions CL1 and the columnar portions CL2 are disposed in a pattern in which a plurality of isosceles triangles T3 are arranged in the X-direction. Similarly, the columnar portions CL2 and the columnar portions CL3, the columnar portions CL3 and the columnar portions CL4 are disposed in a pattern in which a plurality of isosceles triangles are arranged in the X-direction. The angle θ1 of the isosceles triangle T3 is e.g. not less than 30 degrees and not more than 60 degrees. Further, the angle θ1 is an angle formed by the direction dr3 and the X-direction.

As shown in FIG. 6, the respective columnar portions CL1 to CL4 of the first row CLA1 to the fourth row CLA4 are connected to the bit lines BL via the contact portions Cb and the contact portions V1. For instance, an interconnect pattern LP1 as shown in a region B and an interconnect pattern LP2 as shown in a region C are alternately repeated, and thereby, the respective columnar portions CL1 to CL4 are connected to the bit lines BL. The interconnect pattern LP1 forms the bit lines BL1 to BL4 and the interconnect pattern LP2 forms the bit lines BL5 to BL8.

The columnar portions CL in the same numbers are respectively disposed within the region B and the region C. For instance, the four columnar portions CL are disposed within the region B and the region C. The respective four bit lines BL extend into the region B and the region C.

As shown in FIG. 7A to FIG. 7D, in the interconnect pattern LP1, the columnar portions CL1, CL2, CL3, CL4 are respectively connected to the bit lines BL2, BL1, BL3, BL4 via the contact portions V1. In FIG. 7A to FIG. 7D, the contact portions Cb are not shown.

As shown in FIG. 8A to FIG. 8D, in the interconnect pattern LP2, the columnar portions CL1, CL2, CL3, CL4 are respectively connected to the bit lines BL7, BL5, BL6, BL8 via the contact portions V1. In FIG. 8A to FIG. 8D, the contact portions Cb are not shown.

As below, the case where the number of rows of columnar portions CL is five will be described.

Figure 9:
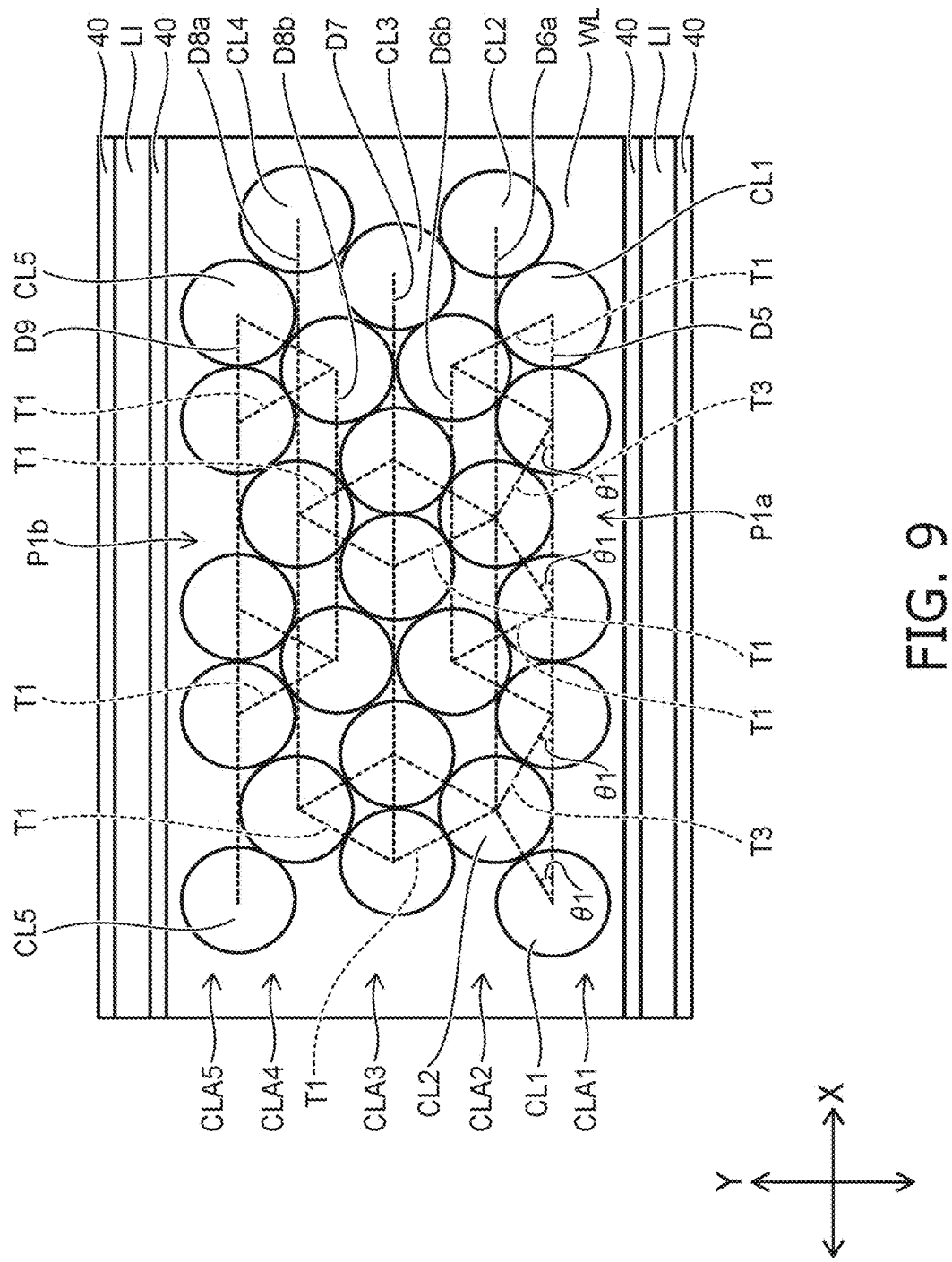
FIG. 9 is a schematic plan view of a semiconductor memory device of a second embodiment.

FIG. 9 is a schematic plan view of a semiconductor memory device of a second embodiment.

Figure 10:
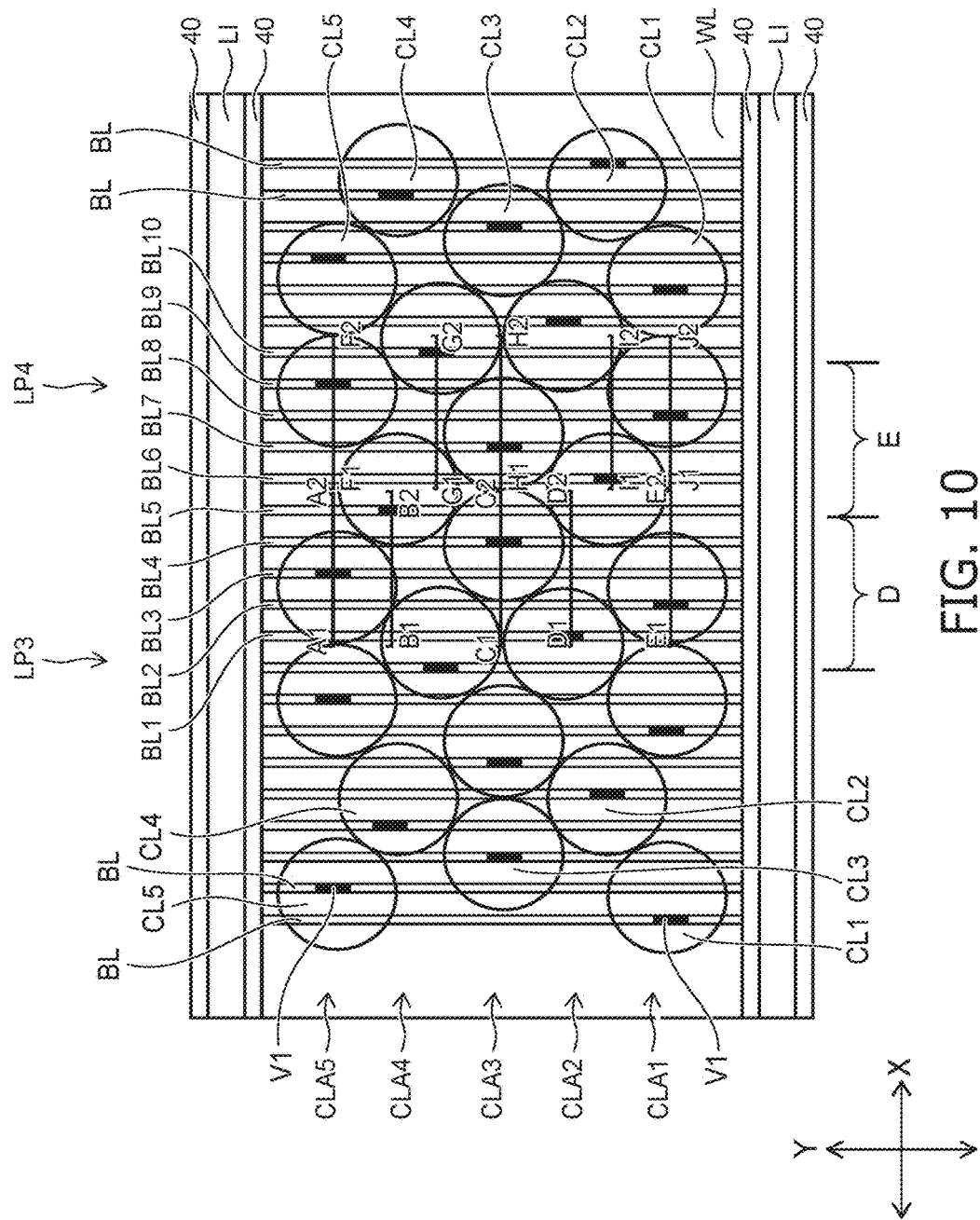
FIG. 10 is a schematic plan view of the semiconductor memory device of the second embodiment.
Figure 11A:
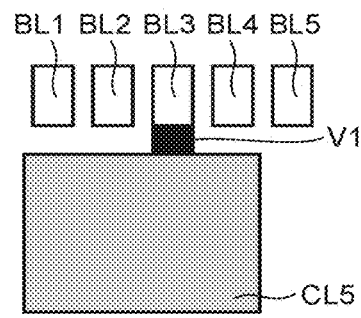
FIG. 11A to FIG. 11E are sectional views along line A1-A2, line B1-B2, line C1-C2, line D1-D2, and line E1-E2 in FIG. 10.
Figure 11B:
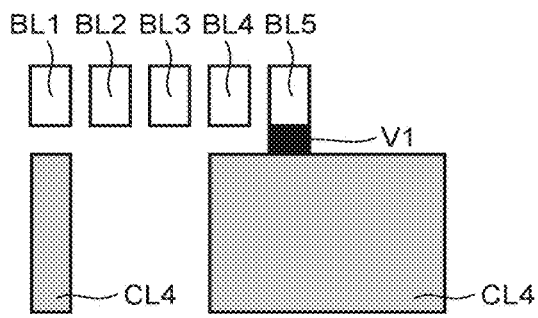
Figure 11C:
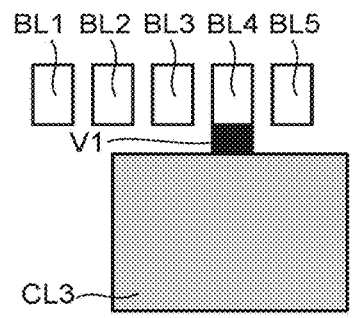
Figure 11D:
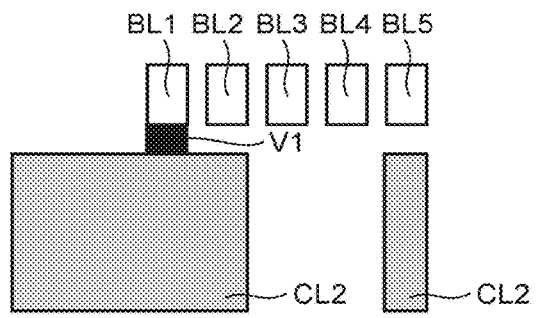
Figure 11E:
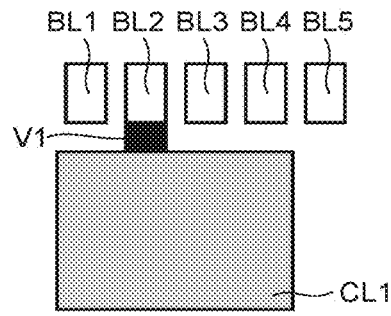
Figure 12A:
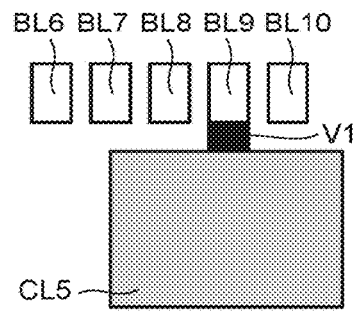
FIG. 12A to FIG. 12E are sectional views along line F1-F2, line G1-G2, line H1-H2, line I1-I2, and line J1-J2 in FIG. 10.
Figure 12B:
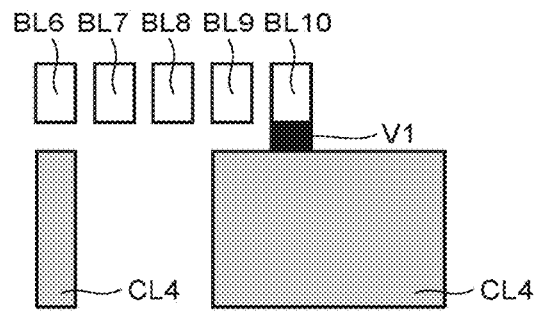
Figure 12C:
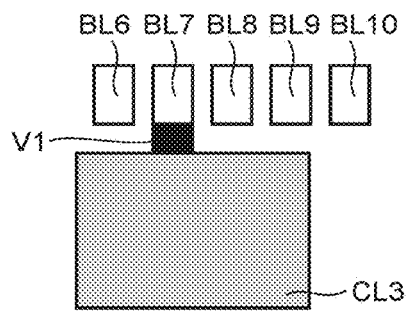
Figure 12D:
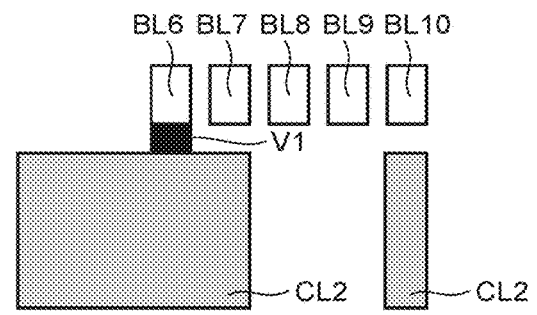
Figure 12E:
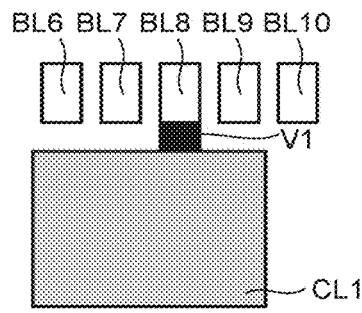

FIG. 10 is a schematic plan view of the semiconductor memory device of the second embodiment.

FIG. 11A to FIG. 11E are sectional views along line A1-A2, line B1-B2, line C1-C2, line D1-D2, and line E1-E2 in FIG. 10.

FIG. 12A to FIG. 12E are sectional views along line F1-F2, line G1-G2, line H1-H2, line I1-I2, and line J1-J2 in FIG. 10.

FIG. 9 is a top view of a memory cell array and shows a disposition of columnar portions CL1 to CL5 piercing one electrode layer WL. FIG. 10 is a top view of the memory cell array showing connection between the respective columnar portions CL1 to CL5 to the bit lines BL. FIG. 11A to FIG. 11E are sectional views showing connection between the columnar portions CL1 to CL5 to the bit lines BL1 to BL5. FIG. 12A to FIG. 12E are sectional views showing connection between the columnar portions CL1 to CL5 to the bit lines BL6 to BL10.

As shown in FIG. 9, a first row CLA1 as a row of the plurality of columnar portions CL1, a second row CLA2 as a row of the plurality of columnar portions CL2, a third row CLA3 as a row of the plurality of columnar portions CL3, a fourth row CLA4 as a row of the plurality of columnar portions CL4, and a fifth row CLA5 as a row of the plurality of columnar portions CL5 are formed in the electrode layer WL.

When straight lines along the X-direction are formed in the electrode layer WL, the respective columnar portions CL1 of the first row CLA1 are located on a straight line D5 along the X-direction. The respective odd-numbered columnar portions CL2 of the second row CLA2 are located on a straight line D6a along the X-direction. The respective even-numbered columnar portions CL2 of the second row CLA2 are located on a straight line D6b along the X-direction. The respective columnar portions CL3 of the third row CLA3 are located on a straight line D7 along the X-direction. The respective odd-numbered columnar portions CL4 of the fourth row CLA4 are located on a straight line D8a along the X-direction. The respective even-numbered columnar portions CL4 of the fourth row CLA4 are located on a straight line D8b along the X-direction. The respective columnar portions CL5 of the fifth row CLA5 are located on a straight line D9 along the X-direction. For instance, the respective columnar portions CL1, CL3, CL5 are arranged on the straight lines along the X-direction and the respective columnar portions CL2, CL4 are arranged in a zig-zag pattern in the X-direction. For instance, the columnar portions CL1 to CL5 are located in line symmetry with respect to the straight line D7. Note that the columnar portions CL1 to CL5 of the first row CLA1 to the fifth row CLA5 are sequentially disposed from the −X-direction to the +X-direction.

The columnar portions CL1 to CL5 are disposed in the zig-zag pattern in the direction crossing the X-direction and the Y-direction. Further, the columnar portions CL1 to CL5 are disposed in a pattern in which a plurality of equilateral triangles T1 are combined in a staggered manner in the X-direction. By the columnar portions CL1 to CL3, a disposition P1a is formed such that the plurality of equilateral triangles T1 are combined in the staggered manner in the X-direction. By the columnar portions CL3 to CL5, a disposition P1b is formed such that the plurality of equilateral triangles T1 are combined in the staggered manner in the X-direction.

Like the disposition P1a in FIG. 4A, the disposition P1b is a disposition in which, in the adjacent equilateral triangles T2 within the disposition PR in FIG. 5, the distance in the X-direction is made larger and the distance in the Y-direction is made smaller. By the dispositions P1a, P1b, it is possible to shorten the distances in the Y-direction in disposing the columnar portions CL1 to CL5.

The columnar portions CL1 and the columnar portions CL2 are disposed in a pattern in which a plurality of isosceles triangles T3 are arranged in the X-direction. Similarly, the columnar portions CL2 and the columnar portions CL3, the columnar portions CL3 and the columnar portions CL4, and the columnar portions CL4 and the columnar portions CL5 are disposed in a pattern in which a plurality of isosceles triangles are arranged in the X-direction. The angle θ1 of the isosceles triangle T3 is e.g. not less than 30 degrees and not more than 60 degrees.

As shown in FIG. 10, the respective columnar portions CL1 to CL5 of the first row CLA1 to the fifth row CLA5 are connected to the bit lines BL via the contact portions Cb and the contact portions V1. For instance, an interconnect pattern LP3 as shown in a region D and an interconnect pattern LP4 as shown in a region E are alternately repeated, and thereby, the respective columnar portions CL1 to CL5 are connected to the bit lines BL. The interconnect pattern LP3 forms the bit lines BL1 to BL5 and the interconnect pattern LP4 forms the bit lines BL6 to BL10. For instance, five columnar portions CL are disposed within the area D and the region E. The respective five bit lines BL extend into the region D and the region E.

As shown in FIG. 11A to FIG. 11E, in the interconnect pattern LP3, the columnar portions CL1, CL2, CL3, CL4, CL5 are respectively connected to the bit lines BL2, BL1, BL4, BL5, BL3 via the contact portions V1. In FIG. 11A to FIG. 11E, the contact portions Cb are not shown.

As shown in FIG. 12A to FIG. 12D, in the interconnect pattern LP4, the columnar portions CL1, CL2, CL3, CL4, CL5 are respectively connected to the bit lines BL8, BL6, BL7, BL10, BL9 via the contact portions V1. In FIG. 12A to FIG. 12E, the contact portions Cb are not shown.

As below, the case where the number of rows of columnar portions is six will be described.

Figure 13:
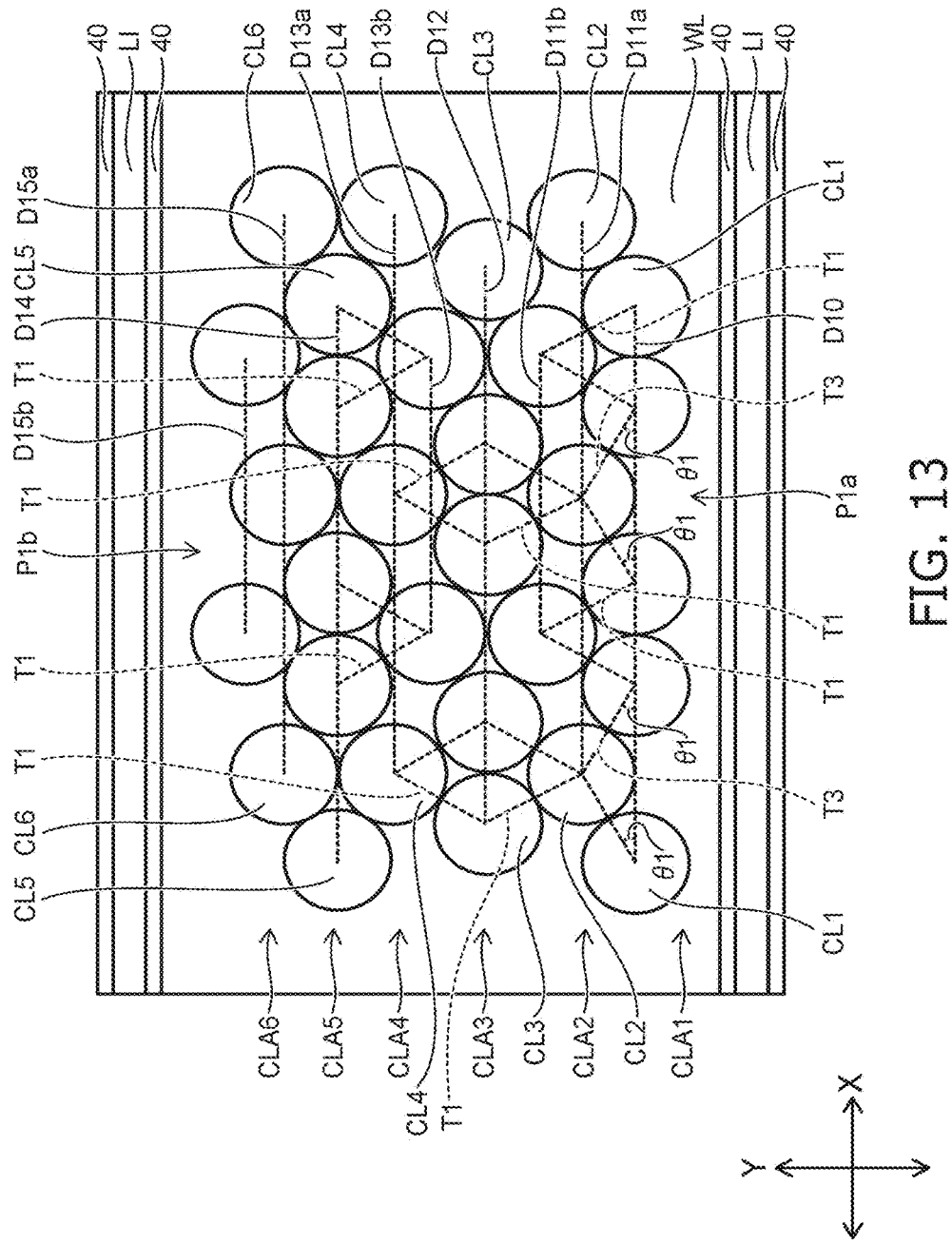
FIG. 13 is a schematic plan view of a semiconductor memory device of a third embodiment.

FIG. 13 is a schematic plan view of a semiconductor memory device of a third embodiment.

FIG. 13 is a top view of a memory cell array and shows a disposition of columnar portions CL1 to CL6 piercing one electrode layer WL.

As shown in FIG. 13, a first row CLA1 as a row of the plurality of columnar portions CL1, a second row CLA2 as a row of the plurality of columnar portions CL2, a third row CLA3 as a row of the plurality of columnar portions CL3, a fourth row CLA4 as a row of the plurality of columnar portions CL4, a fifth row CLA5 as a row of the plurality of columnar portions CL5, and a sixth row CLA6 as a row of the plurality of columnar portions CL6 are formed in the electrode layer WL.

When straight lines along the X-direction are formed in the electrode layer WL, the respective columnar portions CL1 of the first row CLA1 are located on a straight line D10 along the X-direction. The respective odd-numbered columnar portions CL2 of the second row CLA2 are located on a straight line D11a along the X-direction. The respective even-numbered columnar portions CL2 of the second row CLA2 are located on a straight line D11b along the X-direction. The respective columnar portions CL3 of the third row CLA3 are located on a straight line D12 along the X-direction. The respective odd-numbered portions CL4 of the fourth row CLA4 are located on a straight line D13a along the X-direction. The respective even-numbered columnar portions CL4 of the fourth row CLA4 are located on a straight line D13b along the X-direction. The respective columnar portions CL5 of the fifth row CLA5 are located on a straight line D14 along the X-direction. The respective odd-numbered columnar portions CL6 of the sixth row CLA6 are located on a straight line D15a along the X-direction. The respective even-numbered columnar portions CL6 of the sixth row CLA6 are located on a straight line D15b along the X-direction. For instance, the respective columnar portions CL1, CL3, CL5 are arranged on the straight lines along the X-direction and the respective columnar portions CL2, CL4, CL6 are arranged in a zig-zag pattern in the X-direction. Note that the columnar portions CL1 to CL6 of the first row CLA1 to the sixth row CLA6 are sequentially disposed from the −X-direction to the +X-direction.

The columnar portions CL1 to CL6 are disposed in the zig-zag pattern in the direction crossing the X-direction and the Y-direction.

The columnar portions CL1 to CL5 are disposed in a pattern in which a plurality of equilateral triangles T1 are combined in a staggered manner in the X-direction. By the columnar portions CL1 to CL3, a disposition P1a is formed such that the plurality of equilateral triangles T1 are combined in the staggered manner in the X-direction. By the columnar portions CL3 to CL5, a disposition P1b is formed such that the plurality of equilateral triangles T1 are combined in the staggered manner in the X-direction. By the dispositions P1a, P1b, it is possible to shorten the distances in the Y-direction in disposing the columnar portions CL1 to CL6.

The columnar portions CL1 and the columnar portions CL2 are disposed in a pattern in which a plurality of isosceles triangles T3 are arranged in the X-direction. Similarly, the columnar portions CL2 and the columnar portions CL3, the columnar portions CL3 and the columnar portions CL4, the columnar portions CL4 and the columnar portions CL5, and the columnar portions CL5 and the columnar portions CL6 are disposed in a pattern in which a plurality of isosceles triangles T3 are arranged in the X-direction. The angle θ1 of the isosceles triangle T3 is e.g. not less than 30 degrees and not more than 60 degrees.

As below, a variation of the case where the number of rows of columnar portions is six will be described.

Figure 14:
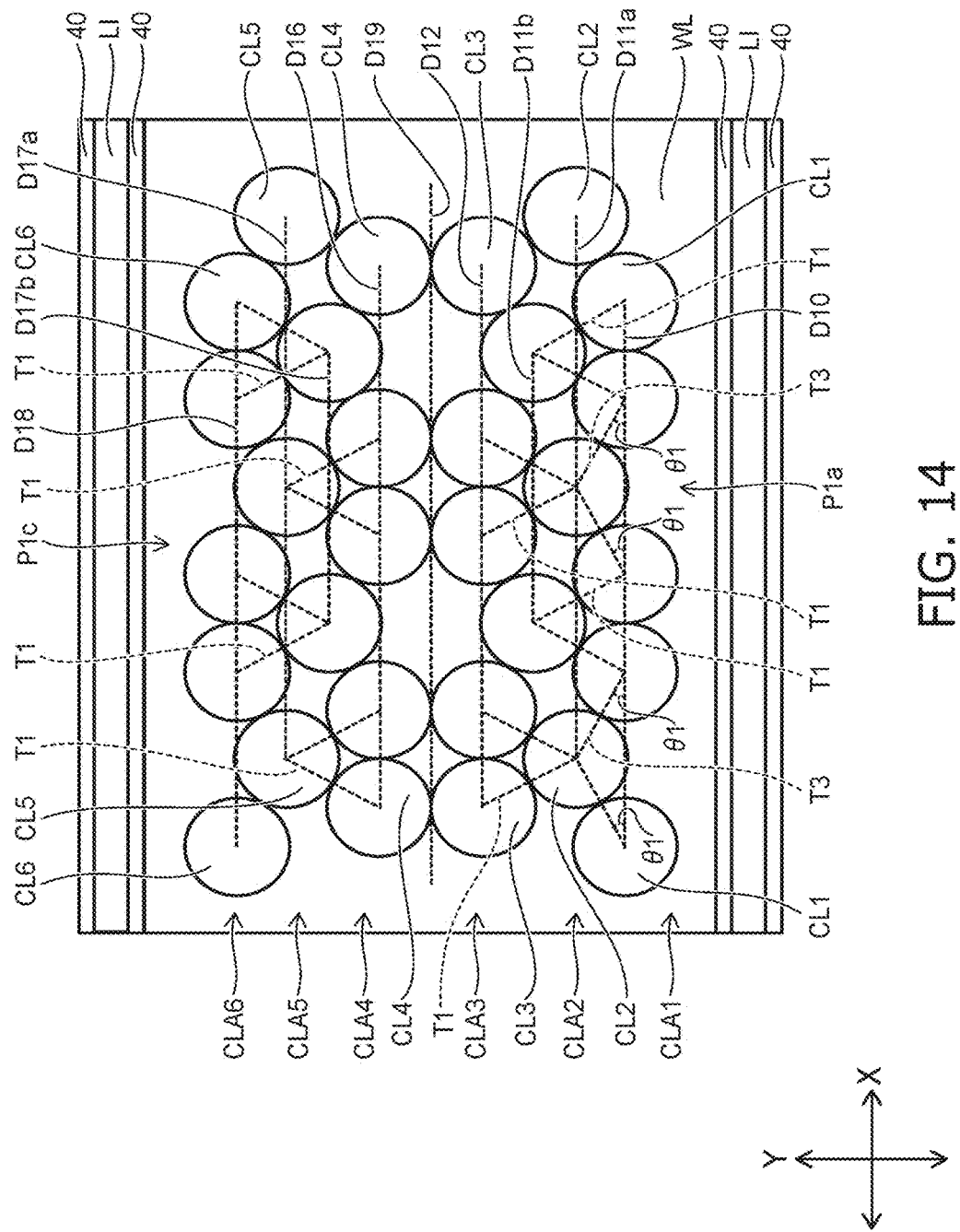
FIG. 14 is a schematic plan view of a semiconductor memory device of a variation of the third embodiment.

FIG. 14 is a schematic plan view of a semiconductor memory device of a variation of the third embodiment.

As shown in FIG. 14, when straight lines along the X-direction are formed in the electrode layer WL, the respective columnar portions CL1 of the first row CLA1 are located on the straight line D10 along the X-direction. The respective odd-numbered columnar portions CL2 of the second row CLA2 are located on the straight line D11a along the X-direction. The respective even-numbered columnar portions CL2 of the second row CLA2 are located on the straight line D11b along the X-direction. The respective columnar portions CL3 of the third row CLA3 are located on the straight line D12 along the X-direction. The respective columnar portions CL4 of the fourth row CLA4 are located on a straight line D16 along the X-direction. The respective odd-numbered columnar portions CL5 of the fifth row CLA5 are located on a straight line D17a along the X-direction. The respective even-numbered columnar portions CL5 of the fifth row CLA5 are located on a straight line D17b along the X-direction. The respective columnar portions CL6 of the sixth row CLA6 are located on a straight line D18 along the X-direction. For instance, the respective columnar portions CL1, CL3, CL4, CL6 are arranged on the straight lines along the X-direction and the respective columnar portions CL2, CL5 are arranged in a zig-zag pattern in the X-direction. Note that the columnar portions CL1 to CL6 of the first row CLA1 to the sixth row CLA6 are sequentially disposed from the −X-direction to the +X-direction.

The columnar portions CL1 to CL6 are disposed in the zig-zag pattern in the direction crossing the X-direction and the Y-direction. Further, the columnar portions CL1 to CL6 are disposed in a pattern in which a plurality of equilateral triangles T1 are combined in a staggered manner in the X-direction. By the columnar portions CL1 to CL3, a disposition P1a is formed such that the plurality of equilateral triangles T1 are combined in the staggered manner in the X-direction. By the columnar portions CL4 to CL6, a disposition P1c is formed such that the plurality of equilateral triangles T1 are combined in the staggered manner in the X-direction.

Like the disposition P1a in FIG. 4A, the disposition P1c is a disposition in which, in the adjacent equilateral triangles T2 within the disposition PR in FIG. 5, the distance in the X-direction is made larger and the distance in the Y-direction is made smaller. By the dispositions P1a, P1c, it is possible to shorten the distances in the Y-direction in disposing the columnar portions CL1 to CL6.

The columnar portions CL1 and the columnar portions CL2 are disposed in a pattern in which a plurality of isosceles triangles T3 are arranged in the X-direction. Similarly, the columnar portions CL2 and the columnar portions CL3, the columnar portions CL3 and the columnar portions CL4, the columnar portions CL4 and the columnar portions CL5, and the columnar portions CL5 and the columnar portions CL6 are disposed in a pattern in which a plurality of isosceles triangles are arranged in the X-direction. The angle θ1 of the isosceles triangle T3 is e.g. not less than 30 degrees and not more than 60 degrees.

In the embodiment, the columnar portions CL1 to CL6 are located in line symmetry with respect to the straight line D19. The straight line D19 is a straight line extending in the X-direction between the columnar portions CL3 and the columnar portions CL4. That is, the first row CLA1 to the sixth row CLA6 are formed so that the disposition of the columnar portions CL1 to CL3 and the disposition of the columnar portions CL4 to CL6 may be symmetric. The disposition of the columnar portions CL1 to CL3 is symmetrically repeated in the Y-direction, and thereby, the first row CLA1 to the sixth row CLA6 are formed.

The case where the number of rows of columnar portions is six is described, however, an even number of rows of columnar portions not less than eight may be employed. For instance, in the case where the number of rows of columnar portions is eight, first row CLA1 to eighth row CLA8 may be formed by symmetric repetition of the disposition of four rows of the columnar portions CL1 to CL4 of the first embodiment in the Y-direction. For instance, in the case where the number of rows of columnar portions CL is ten, first row CLA1 to tenth row CLA10 may be formed by symmetric repetition of the disposition of five rows of the columnar portions CL1 to CL5 of the second embodiment in the Y-direction.

As below, the case where the number of rows of columnar portions is nine will be described.

Figure 15:
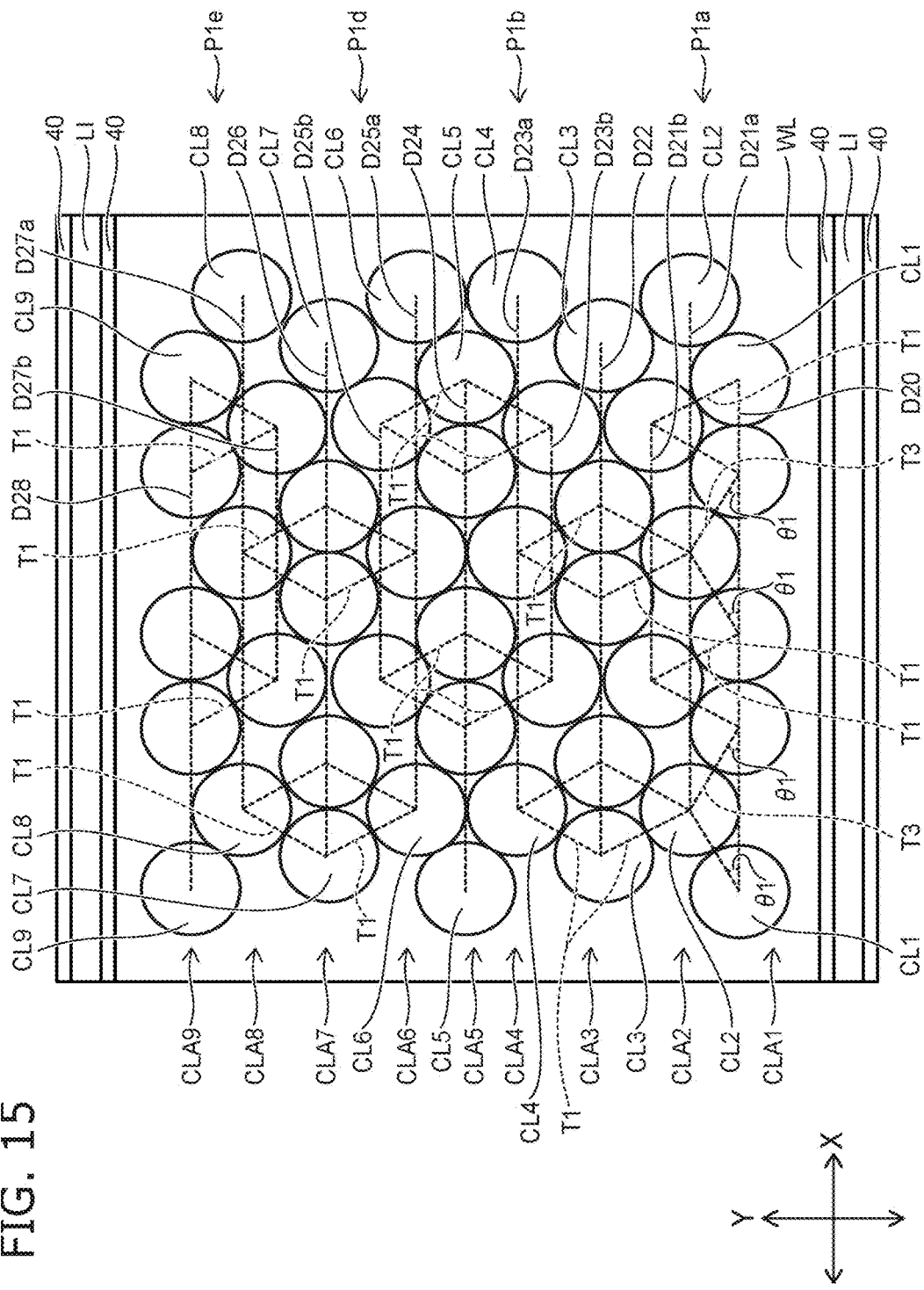
FIG. 15 is a schematic plan view of a semiconductor memory device of a fourth embodiment.

FIG. 15 is a schematic plan view of a semiconductor memory device of a fourth embodiment.

FIG. 15 is a top view of a memory cell array and shows a disposition of columnar portions CL1 to CL9 piercing one electrode layer WL.

As shown in FIG. 15, a first row CLA1 as a row of the plurality of columnar portions CL1, a second row CLA2 as a row of the plurality of columnar portions CL2, a third row CLA3 as a row of the plurality of columnar portions CL3, a fourth row CLA4 as a row of the plurality of columnar portions CL4, a fifth row CLA5 as a row of the plurality of columnar portions CL5, a sixth row CLA6 as a row of the plurality of columnar portions CL6, a seventh row CLA7 as a row of the plurality of columnar portions CL7, an eighth row CLA8 as a row of the plurality of columnar portions CL8, and a ninth row CLA9 as a row of the plurality of columnar portions CL9 are formed in the electrode layer WL.

When straight lines along the X-direction are formed in the electrode layer WL, the respective columnar portions CL1 of the first row CLA1 are located on a straight line D20 along the X-direction. The respective odd-numbered columnar portions CL2 of the second row CLA2 are located on a straight line D21a along the X-direction. The respective even-numbered columnar portions CL2 of the second row CLA2 are located on a straight line D21b along the X-direction. The respective columnar portions CL3 of the third row CLA3 are located on a straight line D22 along the X-direction. The respective odd-numbered columnar portions CL4 of the fourth row CLA4 are located on a straight line D23a along the X-direction. The respective even-numbered columnar portions CL4 of the fourth row CLA4 are located on a straight line D23b along the X-direction. The respective columnar portions CL5 of the fifth row CLA5 are located on a straight line D24 along the X-direction. The respective odd-numbered columnar portions CL6 of the sixth row CLA6 are located on a straight line D25a along the X-direction. The respective even-numbered columnar portions CL6 of the sixth row CLA6 are located on a straight line D25b along the X-direction. The respective columnar portions CL7 of the seventh row CLA7 are located on a straight line D26 along the X-direction. The respective odd-numbered columnar portions CL8 of the eighth row CLA8 are located on a straight line D27a along the X-direction. The respective even-numbered columnar portions CL8 of the eighth row CLA8 are located on a straight line D27b along the X-direction. The respective columnar portions CL9 of the ninth row CLA9 are located on a straight line D28 along the X-direction. For instance, the respective columnar portions CL1, CL3, CL5, CL7, CL9 are arranged on the straight lines along the X-direction and the respective columnar portions CL2, CL4, CL6, CL8 are arranged in a zig-zag pattern in the X-direction. Note that the columnar portions CL1 to CL9 of the first row CLA1 to the ninth row CLA9 are sequentially disposed from the −X-direction to the +X-direction.

The columnar portions CL1 to CL9 are disposed in the zig-zag pattern in the direction crossing the X-direction and the Y-direction. Further, the columnar portions CL1 to CL9 are disposed in a pattern in which a plurality of equilateral triangles T1 are combined in a staggered manner in the X-direction. By the columnar portions CL1 to CL3, a disposition P1a is formed such that the plurality of equilateral triangles T1 are combined in the staggered manner in the X-direction. By the columnar portions CL3 to CL5, a disposition P1b is formed such that the plurality of equilateral triangles T1 are combined in the staggered manner in the X-direction. By the columnar portions CL5 to CL7, a disposition P1d is formed such that the plurality of equilateral triangles T1 are combined in the staggered manner in the X-direction. By the columnar portions CL7 to CL9, a disposition P1e is formed such that the plurality of equilateral triangles T1 are combined in the staggered manner in the X-direction.

Like the disposition P1a in FIG. 4A, the dispositions P1d, P1e are dispositions, in which, in the adjacent equilateral triangles T2 within the disposition PR in FIG. 5, the distance in the X-direction is made larger and the distance in the Y-direction is made smaller. By the dispositions P1a, P1b, P1d, P1e, it is possible to shorten the distances in the Y-direction in disposing the columnar portions CL1 to CL9.

The columnar portions CL1 and the columnar portions CL2 are disposed in a pattern in which a plurality of isosceles triangles T3 are arranged in the X-direction. Similarly, the columnar portions CL2 and the columnar portions CL3, the columnar portions CL3 and the columnar portions CL4, the columnar portions CL4 and the columnar portions CL5, the columnar portions CL5 and the columnar portions CL6, the columnar portions CL6 and the columnar portions CL7, the columnar portions CL7 and the columnar portions CL8, and the columnar portions CL8 and the columnar portions CL9 are disposed in a pattern in which a plurality of isosceles triangles are arranged in the X-direction. The angle θ1 of the isosceles triangle T3 is e.g. not less than 30 degrees and not more than 60 degrees.

As below, a variation of the disposition of the columnar portions will be described.

Figure 16:
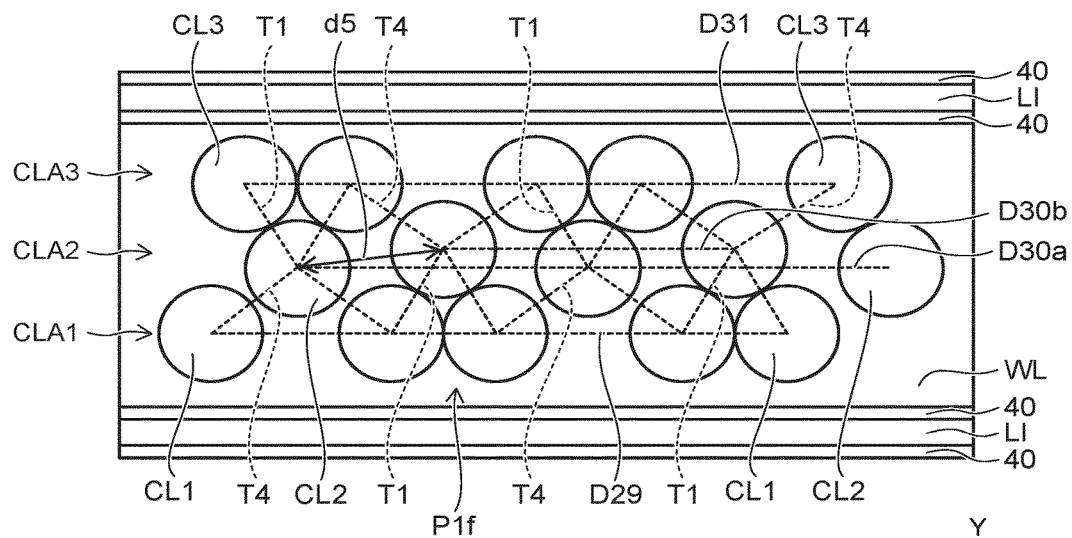
FIG. 16 is a schematic plan view of a semiconductor memory device of a fifth embodiment.

FIG. 16 is a schematic plan view of a semiconductor memory device of a fifth embodiment.

FIG. 16 is a top view of a memory cell array and shows a disposition of columnar portions CL1 to CL3 piercing one electrode layer WL.

As shown in FIG. 16, a first row CLA1 as a row of the plurality of columnar portions CL1, a second row CLA2 as a row of the plurality of columnar portions CL2, and a third row CLA3 as a row of the plurality of columnar portions CL3 are formed in the electrode layer WL. As below, the case where the number of rows of columnar portions is three will be described, and e.g. n (n is an integer number, 3≤n≤18) rows of the columnar portions CL may be formed.

When straight lines along the X-direction are formed in the electrode layer WL, the respective columnar portions CL1 of the first row CLA1 are located on a straight line D29 along the X-direction. The respective odd-numbered columnar portions CL2 of the second row CLA2 are located on a straight line D30a along the X-direction. The respective even-numbered columnar portions CL2 of the second row CLA2 are located on a straight line D30b along the X-direction. The respective columnar portions CL3 of the third row CLA3 are located on a straight line D31 along the X-direction. For instance, the respective columnar portions CL1, CL3 are arranged on the straight lines along the X-direction and the respective columnar portions CL2 are arranged in a zig-zag pattern in the X-direction. Note that the columnar portions CL1 to CL3 of the first row CLA1 to CLA3 are sequentially disposed from the −X-direction to the +X-direction.

The columnar portions CL1 to CL3 are disposed in the zig-zag pattern in the direction crossing the X-direction and the Y-direction. Further, the columnar portions CL1 to CL3 are disposed in a pattern in which a plurality of equilateral triangles T1 are combined in a staggered manner in the X-direction. By the columnar portions CL1 to CL3, a disposition P1f is formed such that the plurality of equilateral triangles T1 are combined in the staggered manner in the X-direction. In the adjacent equilateral triangles T1, one equilateral triangle T1 is an equilateral triangle formed by rotation of the other equilateral triangle T1 to 180 degrees.

Like the disposition P1a in FIG. 4A, the disposition P1f is a disposition in which, in the adjacent equilateral triangles T2 within the disposition PR in FIG. 5, the distance in the X-direction is made larger and the distance in the Y-direction is made smaller. By the disposition P1f, it is possible to shorten the distances in the Y-direction in disposing the columnar portions CL1 to CL3.

Further, in comparison between the disposition P1f and the disposition P1a, the distance between the adjacent equilateral triangles T1 in the disposition P1f is longer. For instance, the distance between the centers of the adjacent columnar portions CL2 of the disposition P1f (e.g. the distance d5) is longer than the distance between the centers of the adjacent columnar portions CL2 of the disposition P1a (e.g. the distance d1 in FIG. 4A). In the embodiment, the columnar portions CL1 to CL3 are located so that the distance between the adjacent equilateral triangles T1 may be made longer.

The columnar portions CL1 and the columnar portions CL2 are disposed in a pattern in which a plurality of isosceles triangles T4 are arranged in the X-direction. Similarly, the columnar portions CL2 and the columnar portions CL3 are disposed in a pattern in which a plurality of isosceles triangles T4 are arranged in the X-direction.

As below, advantages of the embodiments will be described.

Figure 17:
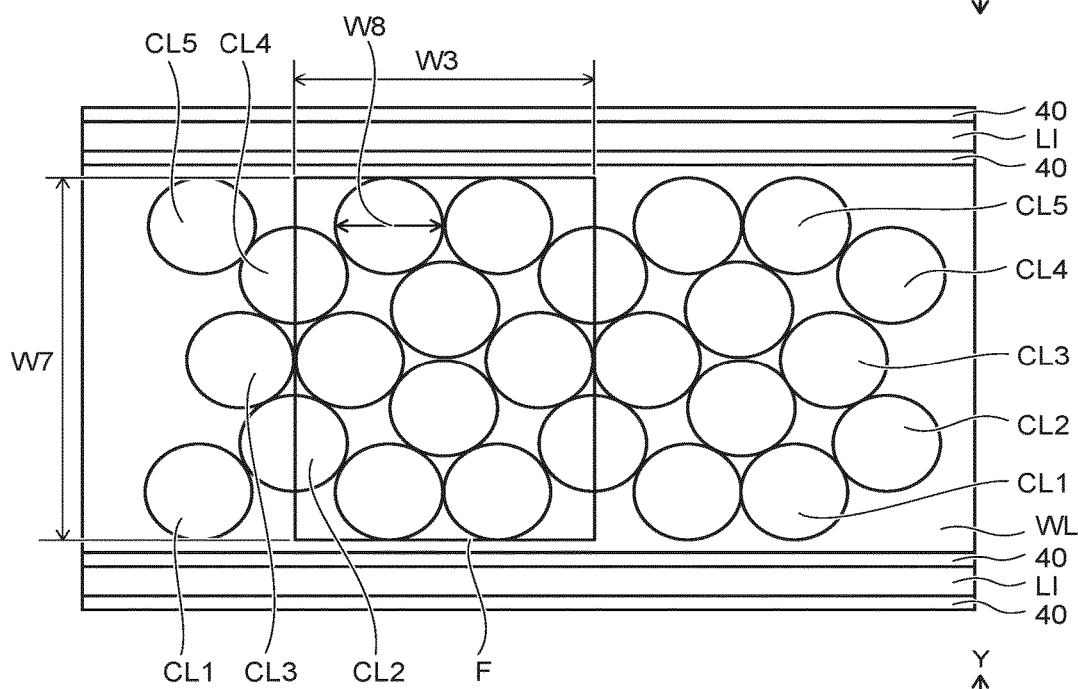
FIG. 17 is a schematic plan view of the semiconductor memory device of the embodiment.

FIG. 17 is a schematic plan view of the semiconductor memory device of the embodiment.

Figure 18:
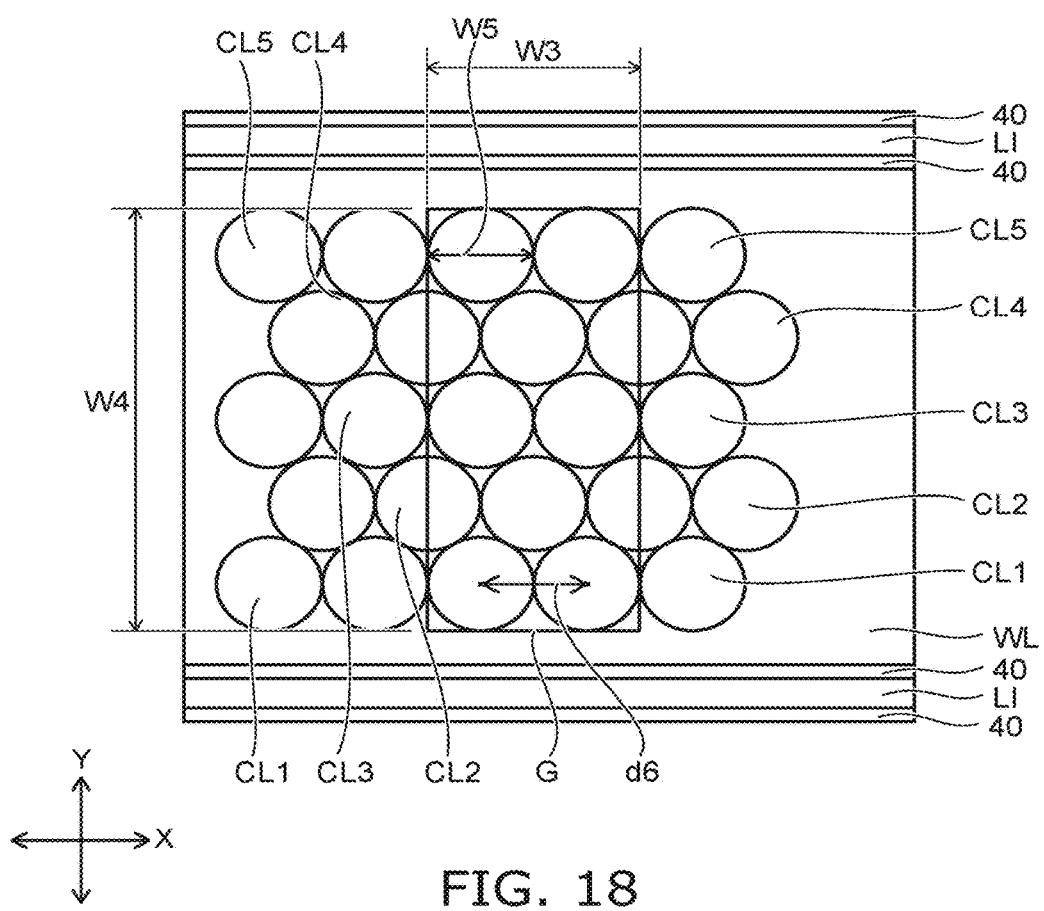
FIG. 18 is a comparative diagram of the semiconductor memory device.

FIG. 18 is a comparative diagram of the semiconductor memory device.

Figure 19:
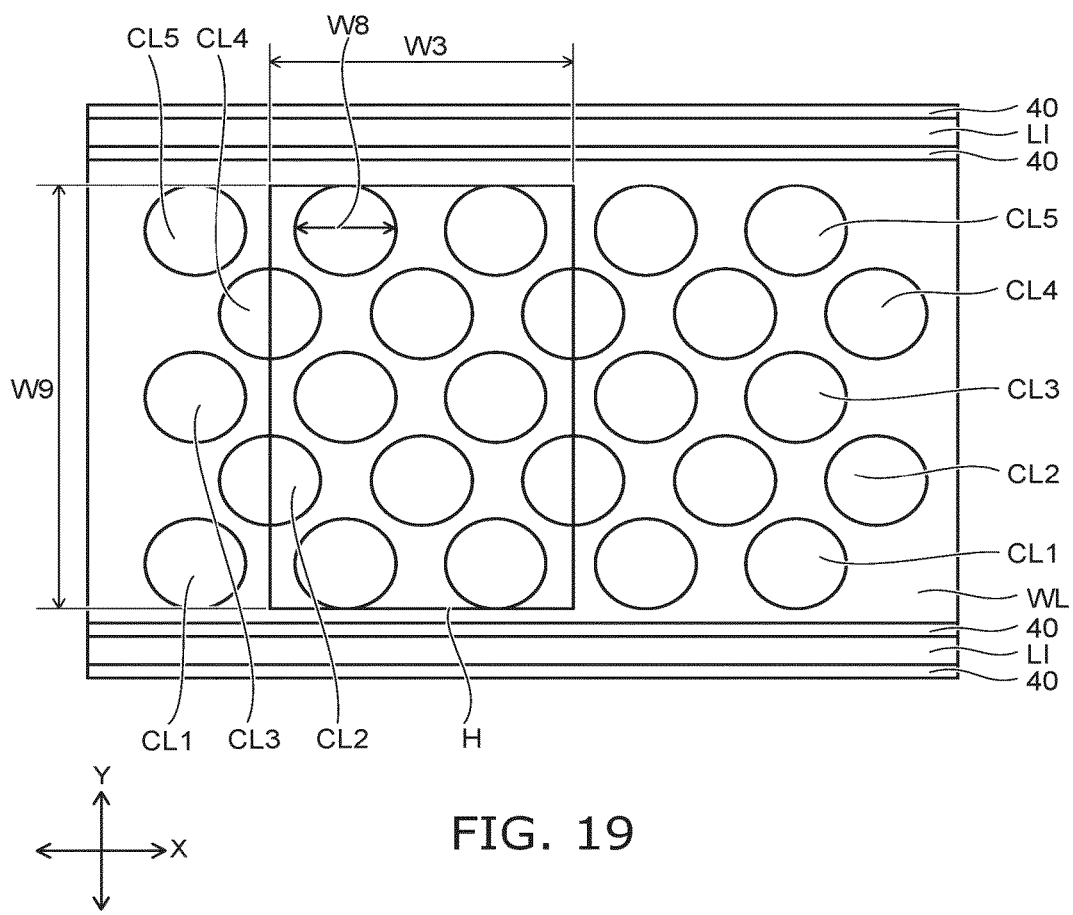
FIG. 19 is a comparative diagram of the semiconductor memory device.

FIG. 19 is a comparative diagram of the semiconductor memory device.

Figure 20:
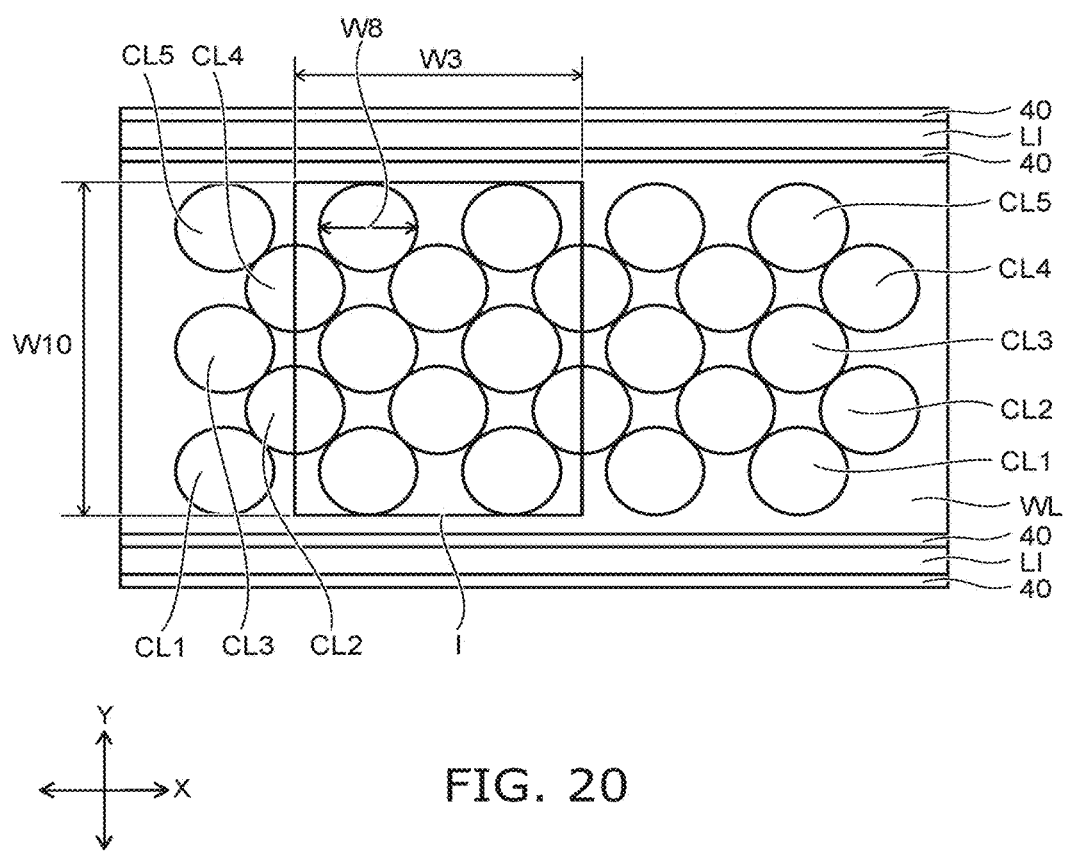
FIG. 20 is a comparative diagram of the semiconductor memory device.

FIG. 20 is a comparative diagram of the semiconductor memory device.

FIG. 17 to FIG. 20 are top views of memory cell arrays and show dispositions of columnar portions CL1 to CL5 piercing one electrode layer WL.

FIG. 17 shows the disposition of the columnar portions CL1 to CL5 of the second embodiment (hereinafter, may be referred to as "main disposition"). FIG. 18 is a reference diagram showing a disposition of the columnar portions CL1 to CL5 in the case where the columnar portions CL are disposed with the highest density as shown in FIG. 5 (hereinafter, may be referred to as "reference disposition 1"). FIG. 19 is a reference diagram showing a disposition of the columnar portions CL1 to CL5 in the case where the distances between the respective columnar portions in the X-direction are increased from the state in which the columnar portions CL are disposed with the highest density as shown in FIG. 5 (hereinafter, may be referred to as "reference disposition 2"). FIG. 20 is a reference diagram showing a disposition of the columnar portions CL1 to CL5 in the case where the distances between the respective columnar portions in the X-direction are increased from the state in which the columnar portions CL are disposed with the highest density as shown in FIG. 5, and then, the distances in the Y-direction are reduced (hereinafter, may be referred to as "reference disposition 3").

In FIG. 18, when the columnar portions CL1 to CL5 are arranged with the highest density, the densest arrangement directions are three directions of the Y-direction and directions inclined to ±30° with respect to the Y-direction. The columnar portions CL1 to CL5 are periodically arranged in an equilateral triangle grid pattern. In FIG. 19, the distances between the respective columnar portions CL in the X-direction are increased based on the reference disposition 1. In FIG. 20, the distances in the Y-direction are reduced so that the respective columnar portions CL may be closer to one another based on the reference disposition 2.

As shown in FIG. 18, suppose that widths of a region G in the X-direction and the Y-direction are W3 and W4, respectively, a width of the respective columnar portions CL1 to CL5 is W5, and a distance between centers of the adjacent columnar portions is d6. In this case, the pitch of the bit lines BL is expressed by d6/5. Further, the half pitch of the bit lines BL is expressed by d6/10.

As shown in FIG. 17, when a width of a region F in the X-direction is set to be the same as the width W3 of the region G in the X-direction, a width of the region F in the Y-direction is W7 and the width of the respective columnar portions CL1 to CL5 is W8. The width W7 is smaller than the width W4. The width W8 is smaller than the width W5.

As shown in FIG. 19, when a width of a region H in the X-direction is set to be the same as the width W3 of the region G in the X-direction, a width of the region H in the Y-direction is W9 and the width of the respective columnar portions CL1 to CL5 is W8. The width W9 is smaller than the width W4 and larger than the width W7.

As shown in FIG. 20, when a width of a region I in the X-direction is set to be the same as the width W3 of the region G in the X-direction, a width of the region I in the Y-direction is W10 and the width of the respective columnar portions CL1 to CL5 is W8. The width W10 is smaller than the width W4 and the width W9 and larger than the width W7.

When the width W8 of the respective columnar portions CL1 to CL5 in the reference disposition 2, the reference disposition 3, and the main disposition is 0.74 times the width W5 of the respective columnar portions CL1 to CL5 of the reference disposition 1, the width W7 of the region F in the Y-direction is 0.616 times the width W4 of the region G in the Y-direction. Further, the width W7 is 0.84 times the width W9 of the region H in the Y-direction and 0.95 times the width W10 of the region I in the Y-direction. For instance, suppose that the width W3 is 300 nanometers and the width W4 is 670 nanometers, the width W7 is 413 nanometers.

In comparison of the main disposition with the reference disposition 2, the reference disposition 3, the distances in the Y-direction in which the columnar portions CL are disposed may be made smaller in the main disposition. It is possible to dispose the columnar portions CL to increase the number of columnar portions CL per unit area of the electrode layer WL, and thereby, it is possible to suppress reduction in density of formation of the memory cells MC in the semiconductor memory device 1.

Or, in the case where the columnar portions CL are disposed as in the reference disposition 1, when the number of rows of columnar portions CL increases (the number of memory holes increases) or the sizes of the columnar portions CL are smaller, the intervals of the bit lines BL may be smaller and a defect may occur in memory operation. On the other hand, in the case where the columnar portions CL are disposed as in the main disposition, even when the number of rows of columnar portions CL increases or the sizes of the columnar portions CL are smaller, it is possible to maintain the intervals of the bit lines BL. Thereby, it is possible to suppress a defect occurring in memory operation.

FIG. 21A to FIG. 21D show characteristics in the semiconductor memory device.

FIG. 21A to FIG. 21D are graphs respectively showing reduction rates of the distances in the Y-direction in which the columnar portions CL are disposed with respect to reduction rates of the columnar portions CL when the numbers of rows of columnar portions CL are three, four, five, and nine.

The horizontal axes of FIG. 21A to FIG. 21D indicate the reduction rates CR (%) of the columnar portions CL. That means that the sizes of the columnar portions CL are smaller as the reduction rates are higher.

The vertical axes of FIG. 21A to FIG. 21D indicate the reduction rates DR (%) of the distances in the Y-direction in which the columnar portions CL are disposed. The distances in the Y-direction in which the columnar portions CL are disposed correspond to e.g. the width W7 in FIG. 17, the width W9 in FIG. 19, and the width W10 in FIG. 20. The reduction rates of the distances in the Y-direction are relative values, suppose that the distances in the Y-direction in which the columnar portions CL are disposed are 100% when the columnar portions CL are disposed with the highest density, and then, the distances between the respective columnar portions CL in the X-direction are increased (e.g. the reference disposition 2 in FIG. 19). That means that the distances in the Y-direction are smaller as the reduction rates are lower.

Figure 21B:
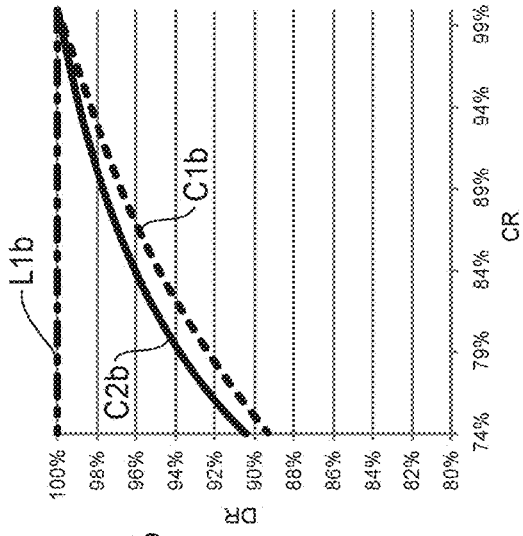
FIG. 21A to FIG. 21D show characteristics in the semiconductor memory device.
Figure 21D:
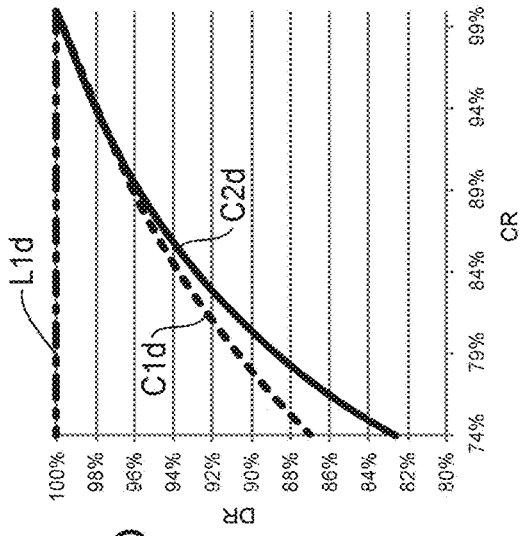
Figure 21A:
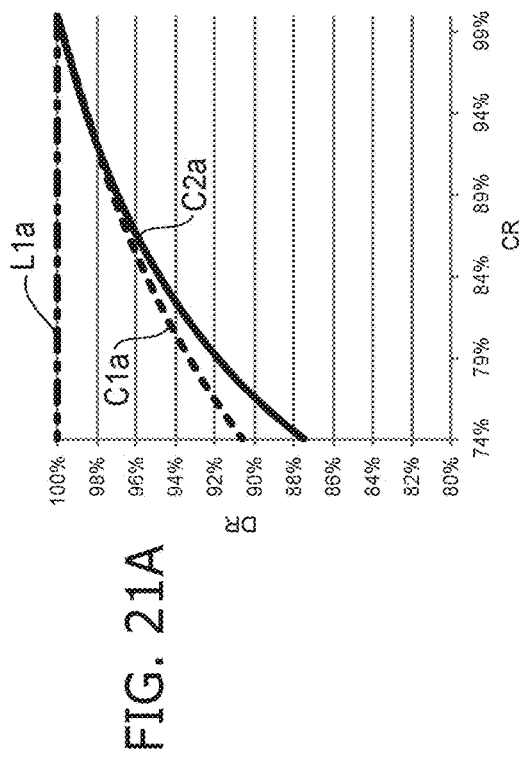
Figure 21C:
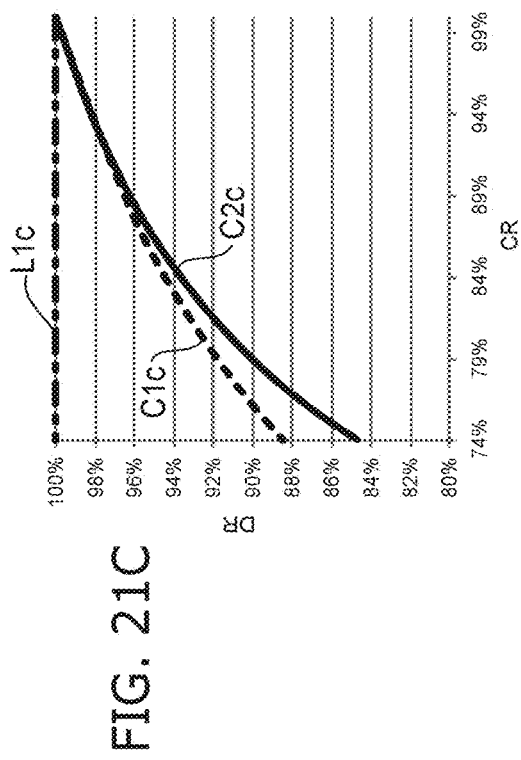

Lines L1a to L1d show reduction rates of the distances in the Y-direction in which the columnar portions CL are disposed when the columnar portions CL are disposed with the highest density as shown in FIG. 5, and then, the distances between the respective columnar portions CL in the X-direction are increased. Curves C1a to C1d show reduction rates of the distances in the Y-direction in which the columnar portions CL are disposed when the columnar portions CL are disposed with the highest density as shown in FIG. 5, the distances between the respective columnar portions CL in the X-direction are increased, and then, the distances in the Y-direction are reduced. Curves C2a to C2d show reduction rates of the distances in the Y-direction in which the columnar portions CL of the embodiment are disposed. For instance, FIG. 21C shows the reduction rates of the distances in the Y-direction in which the columnar portions CL are disposed when the number of rows of columnar portions CL is five, and accordingly, the line L1c, the curve C1c, and the curve C2c show the reduction rates of the distances in the Y-direction in which the columnar portions CL are disposed in the reference disposition 2 in FIG. 19, the reference disposition 3 in FIG. 20, and the main disposition in FIG. 17, respectively.

From FIG. 21A to FIG. 21D, in the disposition of the columnar portions CL of the embodiment corresponding to the curves C2a to C2d, it is possible to reduce the distances in the Y-direction in which the columnar portions CL are disposed. From FIG. 21A, FIG. 21C, and FIG. 21D, when the number of rows of columnar portions is an odd number, in the disposition of the columnar portions CL of the embodiment, it is possible to further reduce the distances in the Y-direction in which the columnar portions CL are disposed. Therefore, in the embodiment, it is possible to dispose the columnar portions CL so that the number of columnar portions CL per unit area of the electrode layer WL may be larger. Thereby, it is possible to suppress reduction in density of formation of the memory cells MC in the semiconductor memory device 1.

Figure 22:
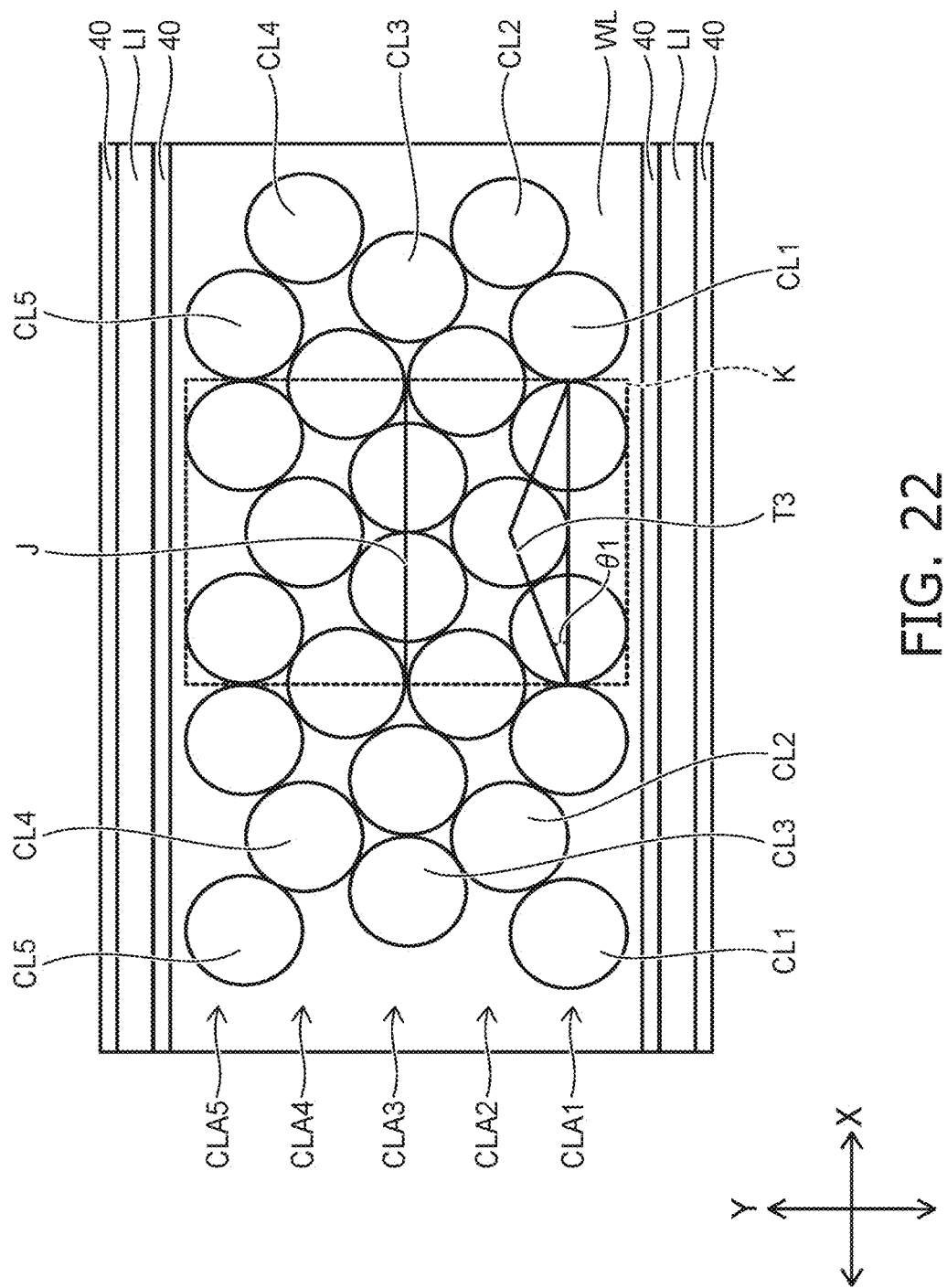
FIG. 22 is a schematic plan view of the semiconductor memory device of the embodiment.

FIG. 22 is a schematic plan view of the semiconductor memory device of the embodiment.

Figure 23A:
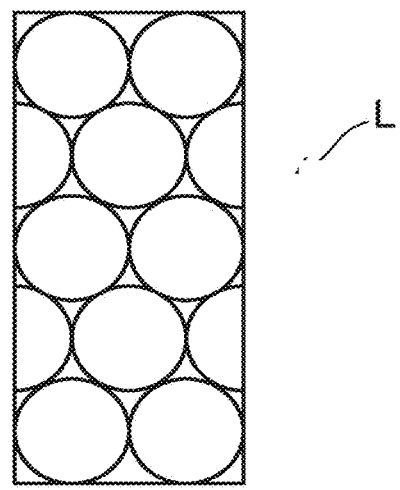
FIG. 23A to FIG. 23C show dispositions of columnar portions.
Figure 23B:
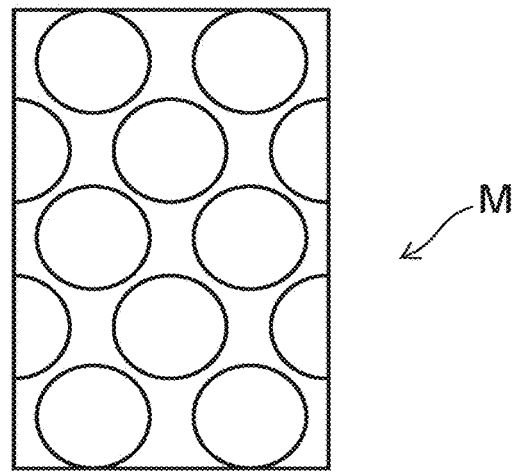
Figure 23C:
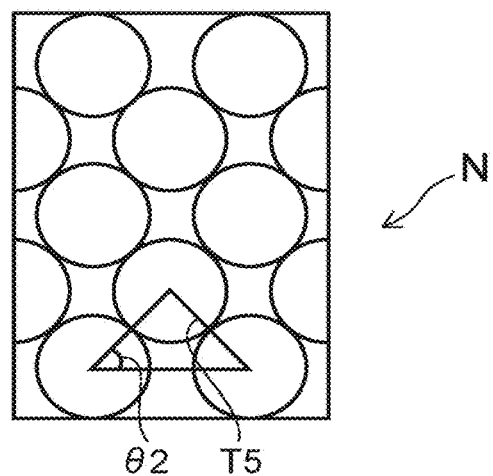

FIG. 23A to FIG. 23C show dispositions of columnar portions.

FIG. 24A to FIG. 24D show characteristics in the semiconductor memory device.

FIG. 25A to FIG. 25D show characteristics in the semiconductor memory device.

FIG. 22 is a top view of a memory cell array and shows a disposition of the columnar portions CL1 to CL5 piercing one electrode layer WL. FIG. 22 shows the disposition of the columnar portions CL1 to CL5 of the second embodiment. FIG. 23A to FIG. 23C show dispositions of columnar portions CL. FIG. 24A to FIG. 24D and FIG. 25A to FIG. 25D are graphs showing density of formation of the columnar portions CL.

As shown in FIG. 22, when the number of rows of columnar portions CL is five, the columnar portions CL1 to CL5 are disposed by adjoining repetition of the region J in the X-direction and inversion to 180 degrees and repetition of the region J in the Y-direction. The region J is a part surrounded by a solid line.

For instance, when the number of rows of columnar portions CL is an odd number, the columnar portions CL are disposed by adjoining repetition of the region J in the X-direction and inversion to 180 degrees and repetition of the region J in the Y-direction. That is, when the number of rows of columnar portions CL is (2 m1+1) (m1 is an integer number, 1≤m1≤8), the columnar portions CL are disposed by adjoining repetition of the region J in the X-direction and inversion to 180 degrees and repetition of the region J in the Y-direction.

For instance, when the number of rows of columnar portions CL is an even number, the columnar portions CL are disposed by adjoining repetition of the region J in the X-direction and inversion to 180 degrees and repetition of the region J in the Y-direction, and the columnar portions CL of the last row are disposed in a zig-zag pattern in the X-direction. That is, when the number of rows of columnar portions CL is 2m2 (m2 is an integer number, 2≤m2≤8), the columnar portions CL are disposed by adjoining repetition of the region J in the X-direction and inversion to 180 degrees and repetition of the region J in the Y-direction, and the columnar portions CL of the 2m2 row are disposed in a zig-zag pattern in the X-direction.

Further, when the number of rows of columnar portions CL is five, the columnar portions CL of the embodiment are disposed by repetitive formation of a region K in the X-direction. The region K is a part surrounded by a dotted line, and its area corresponds to the unit area. Note that, as shown in FIG. 23A, when the columnar portions CL are disposed with the highest density as shown in FIG. 5, the columnar portions CL are disposed by repetitive formation of a region L in the X-direction. The area of the region L corresponds to the unit area when the columnar portions CL are disposed with the highest density. As shown in FIG. 23B, when the columnar portions CL are disposed with the highest density, and then, the distances between the respective columnar portions CL in the X-direction are increased, the columnar portions CL are disposed by repetitive formation of a region M in the X-direction. The area of the region M corresponds to the unit area when the columnar portions CL are disposed with the highest density, and then, the distances between the respective columnar portions CL in the X-direction are increased. As shown in FIG. 23C, when the columnar portions CL are disposed with the highest density, the distances between the respective columnar portions CL in the X-direction are increased, and then, the distances in the Y-direction are reduced, the columnar portions CL are disposed by repetitive formation of a region N in the X-direction. The area of the region N corresponds to the unit area when the columnar portions CL are disposed with the highest density, the distances between the respective columnar portions CL in the X-direction are increased, and then, the distances in the Y-direction are reduced.

FIG. 24A to FIG. 24D respectively show density of formation of the columnar portions CL with respect to the lengths of the regions repeatedly formed in the X-direction when the numbers of rows of columnar portions CL are three, four, five, and nine.

The horizontal axes of FIG. 24A to FIG. 24D indicate lengths LE (micrometers) in the X-direction of the regions repeatedly formed in the X-direction. The lengths in the X-direction of the regions repeatedly formed in the X-direction correspond to lengths of e.g. the region K, the region L, the region M, the region N, etc. in the X-direction.

The vertical axes of FIG. 24A to FIG. 24D indicate density DE (%) of formation of the columnar portions CL. The density of formation of the columnar portions CL is expressed by the number of columnar portions CL per unit area.

Figure 24A:
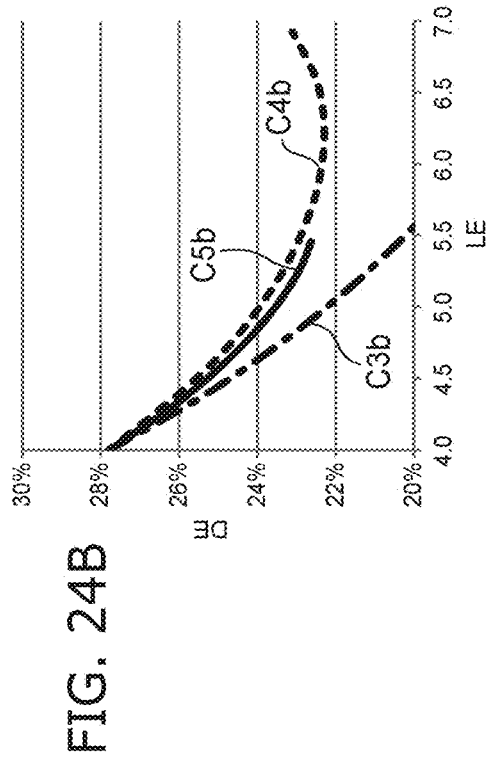
FIG. 24A to FIG. 24D show characteristics in the semiconductor memory device.
Figure 24B:
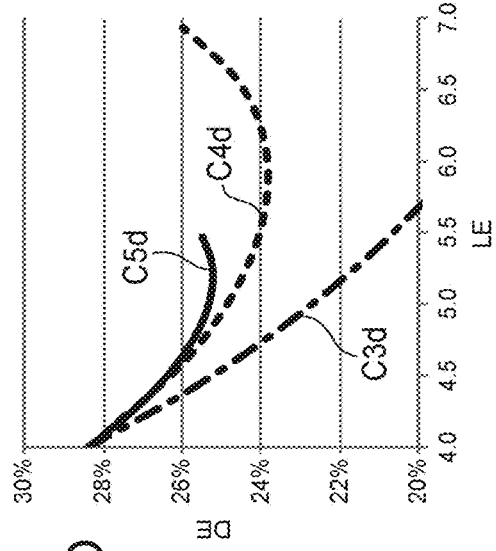
Figure 24C:
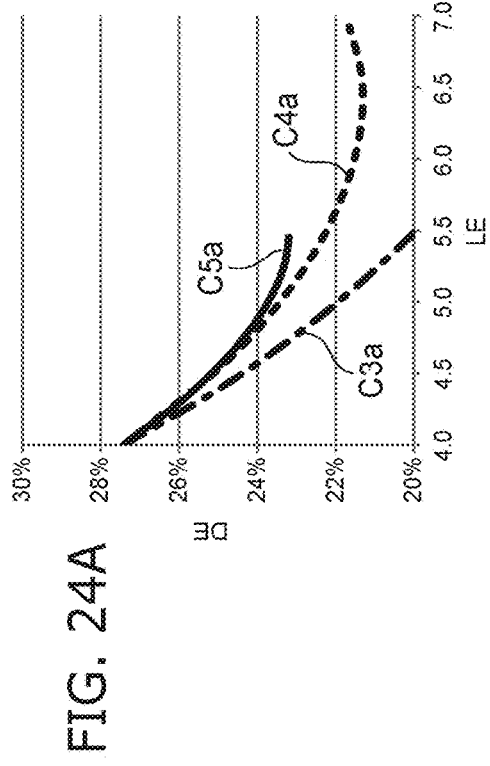
Figure 24D:
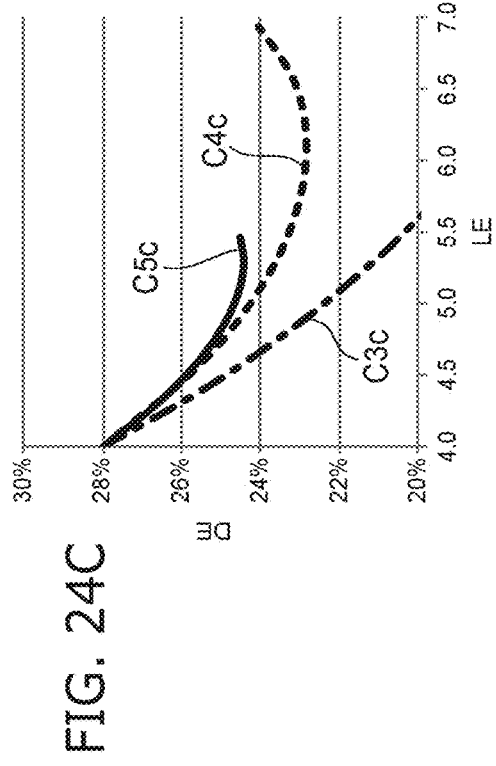
Figure 25A:
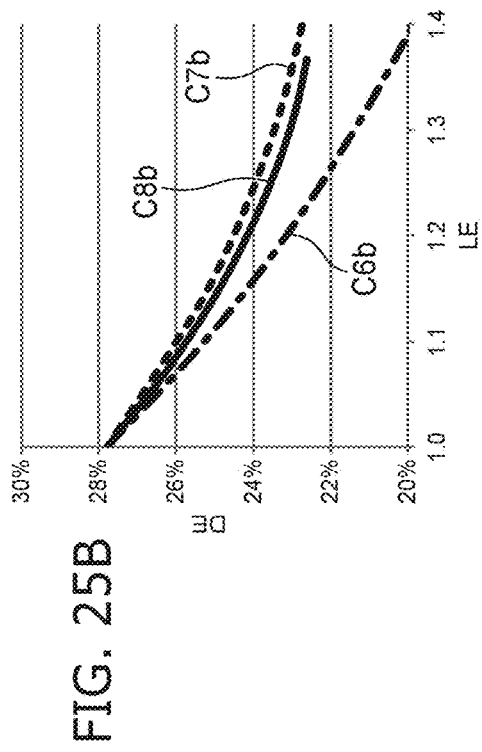
FIG. 25A to FIG. 25D show characteristics in the semiconductor memory device.
Figure 25B:
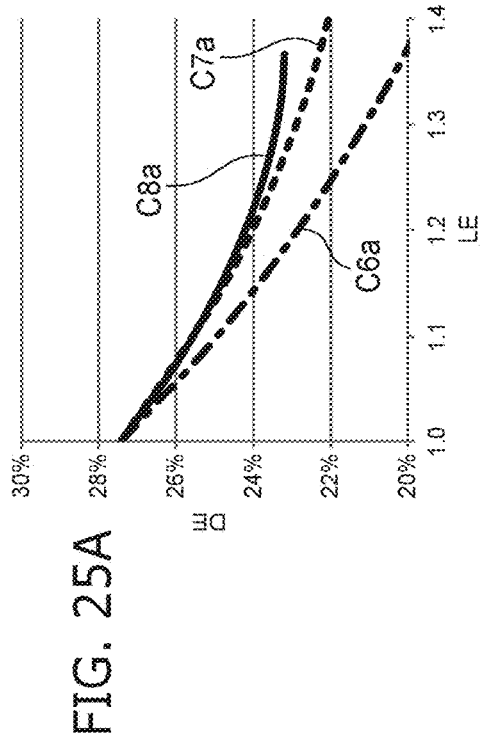
Figure 25C:
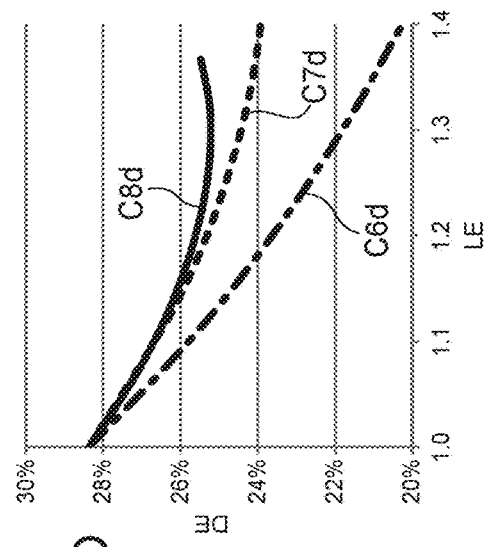
Figure 25D:
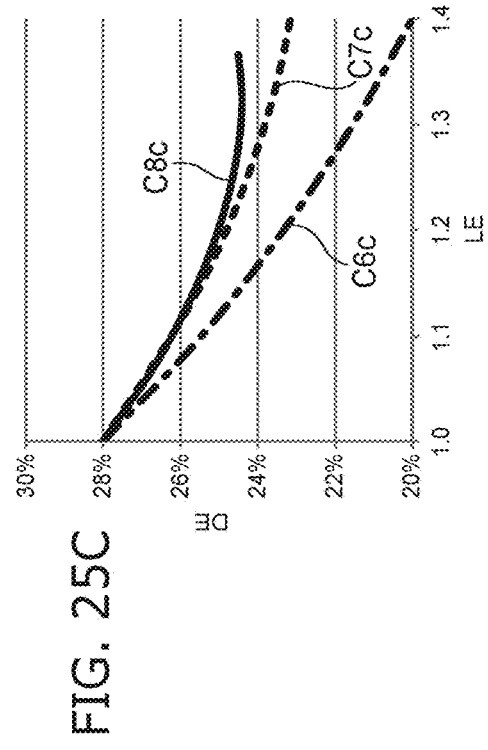

Curves C3a to C3d show values of density of formation of the columnar portions CL when the columnar portions are disposed with the highest density, and then, the distances between the respective columnar portions CL in the X-direction are increased. Curves C4a to C4d show values of density of formation of the columnar portions CL when the columnar portions CL are disposed with the highest density, the distances between the respective columnar portions CL in the X-direction are increased, and then, the distances in the Y-direction are reduced. Curves C5a to C5d show values of density of formation of the columnar portions CL of the embodiment. For instance, FIG. 24C shows values of density of formation of the columnar portions CL when the number of rows of columnar portions CL is five, and accordingly, the curve C3c, the curve C4c, and the curve C5c show the values of density of formation of the columnar portions CL in the reference disposition 2 in FIG. 19, the reference disposition 3 in FIG. 20, and the main disposition in FIG. 17, respectively.

For instance, in the curves C3a to C3d, the density of formation of the columnar portions CL is calculated from a value obtained by division of the number of columnar portions CL within a region repeated in the X-direction by the area of the region repeated in the X-direction. For instance, in the curve C3c, the density of formation of the columnar portions CL is calculated from a value obtained by division of the number of columnar portions CL within the region M in FIG. 23B (ten) by the area of the region M.

For instance, in the curves C4a to C4d, the density of formation of the columnar portions CL is calculated from a value obtained by division of the number of columnar portions CL within a region repeated in the X-direction by the area of the region repeated in the X-direction. For instance, in the curve C4c, the density of formation of the columnar portions CL is calculated from a value obtained by division of the number of columnar portions CL within the region N in FIG. 23C (ten) by the area of the region N.

For instance, in the curves C5a to C5d, the density of formation of the columnar portions CL is calculated from a value obtained by division of the number of columnar portions CL within a region repeated in the X-direction by the area of the region repeated in the X-direction. For instance, in the curve C5c, the density of formation of the columnar portions CL is calculated from a value obtained by division of the number of columnar portions CL within the region K in FIG. 22 (ten) by the area of the region K.

That means that the number of columnar portions CL per unit area is smaller as the density is lower. Note that, when the columnar portions CL are disposed with the highest density, the density of formation of the columnar portions CL is calculated by division of the number of columnar portions CL within the region L in FIG. 23A (ten) by the area of the region L, and the value is 28.87%. Note that, regardless of the number of rows of formation of columnar portions CL, the density of formation of the columnar portions CL when the columnar portions CL are disposed with the highest density is a constant value (28.87%).

FIG. 25A to FIG. 25D respectively show density of formation of the columnar portions CL with respect to the lengths of the regions repeatedly formed in the X-direction when the numbers of rows of columnar portions CL are three, four, five, and nine. FIG. 25A to FIG. 25D correspond to graphs with changes in values of the horizontal axes in FIG. 24A to FIG. 24D. The horizontal axes of FIG. 25A to FIG. 25D relatively indicate the values of the horizontal axes of FIG. 24A to FIG. 24D with 4.0 as the value of the horizontal axes of FIG. 24A to FIG. 24D as a reference value (1.0).

Curves C6a to C6d correspond to the curves C3a to C3d in FIG. 24A to FIG. 24D. Curves C7a to C7d correspond to the curves C4a to C4d in FIG. 24A to FIG. 24D. Curves C8a to C8d correspond to the curves C5a to C5d in FIG. 24A to FIG. 24D.

From FIG. 24A to FIG. 24D and FIG. 25A to FIG. 25D, it is possible to increase the density of formation of the columnar portions CL by the disposition of the columnar portions CL of the embodiment corresponding to the curves C5a to C5d (curves C8a to C8d). From FIG. 24A, FIG. 24C, FIG. 24D, FIG. 25A, FIG. 25C, and FIG. 25D, when the number of rows of columnar portions is an odd number, it is possible to further increase the density of formation of the columnar portions CL by the disposition of the columnar portions CL of the embodiment. Therefore, in the embodiment, it is possible to dispose the columnar portions CL so that the number of columnar portions CL per unit area of the electrode layer WL may be larger. Thereby, it is possible to suppress reduction in density of formation of the memory cells MC in the semiconductor memory device 1.

FIG. 26A to FIG. 26D show characteristics in the semiconductor memory device.

FIG. 26A to FIG. 26D are graphs showing density of formation of the columnar portions CL and respectively showing density of formation of the columnar portions CL with respect to the angles between grids when the numbers of rows of columnar portions CL are three, four, five, and nine.

The horizontal axes of FIG. 26A to FIG. 26D indicate angles θ (degrees) between grids. The angles θ between grids correspond to e.g. the angle θ1 of the isosceles triangles T3 within the region K in FIG. 22 and an angle θ2 of isosceles triangles T5 within the region N in FIG. 23C.

The vertical axes of FIG. 26A to FIG. 26D indicate density DE (arbitrary unit) of formation of columnar portions CL. The density of formation of columnar portions CL is expressed by the area of the columnar portions CL per unit area. That means that the number of columnar portions CL per unit area is smaller as the density is lower. Note that the calculation is performed with a radius of the columnar portion CL as one.

Curves C9a to C9d show values of density of formation of the columnar portions CL when the columnar portions CL are disposed with the highest density, the distances between the respective columnar portions CL in the X-direction are increased, and then, the distances in the Y-direction are reduced. Curves C10a to C10d show values of density of formation of the columnar portions CL of the embodiment.

Figure 26A:
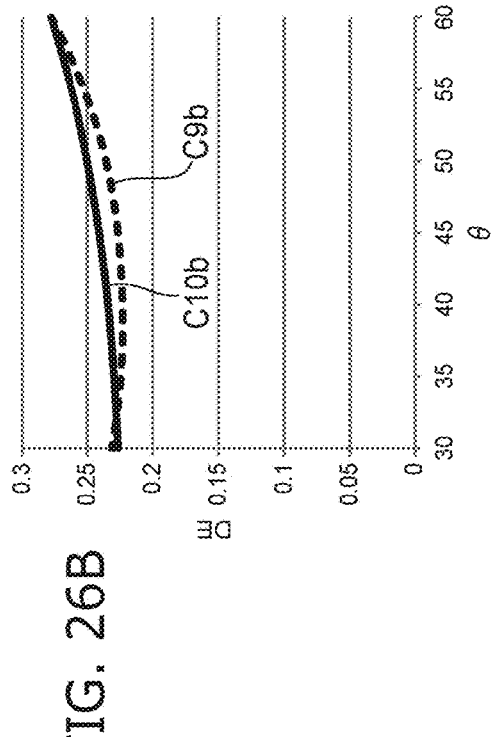
FIG. 26A to FIG. 26D show characteristics in the semiconductor memory device.
Figure 26B:
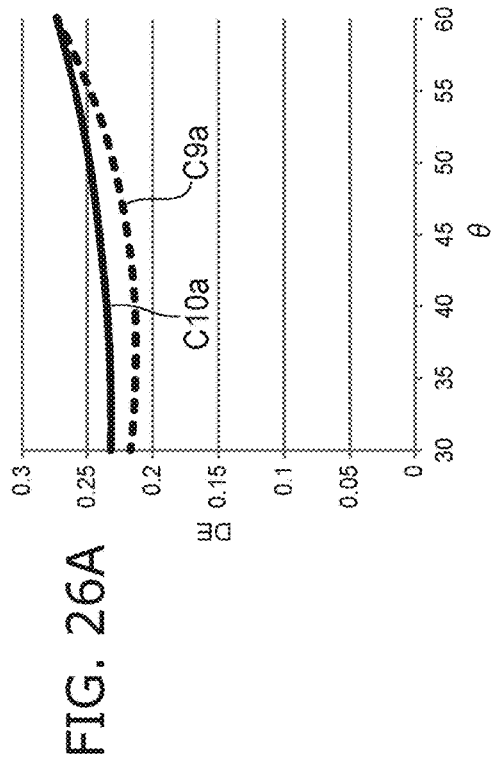
Figure 26C:
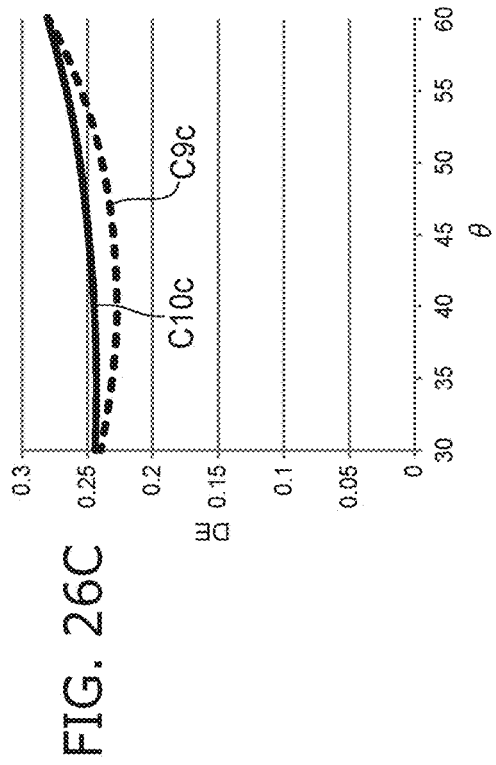
Figure 26D:
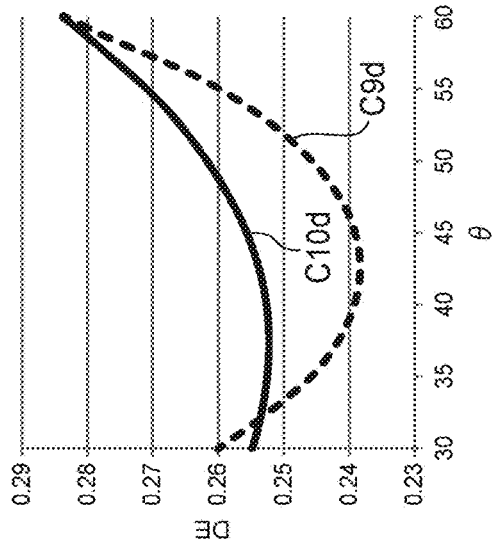

For instance, FIG. 26C shows values of density of formation of the columnar portions CL when the number of rows of columnar portions CL is five, and accordingly, the curve C9c and the curve C10c show the values of density of formation of the columnar portions CL in the reference disposition 3 in FIG. 20 and the main disposition in FIG. 17, respectively.

For instance, in the curves C9a to C9d, the density of formation of the columnar portions CL is a value obtained by division of the area of columnar portions CL within a region repeated in the X-direction by the area of the region repeated in the X-direction. For instance, in the curve C9c, the density of formation of the columnar portions CL is a value obtained by division of the area calculated from the number of columnar portions CL within the region N in FIG. 23C (ten) by the area of the region N.

For instance, in the curves C10a to C10d, the density of formation of the columnar portions CL is a value obtained by division of the area of columnar portions CL within a region repeated in the X-direction by the area of the region repeated in the X-direction. For instance, in the curve C10c, the density of formation of the columnar portions CL is a value obtained by division of the area calculated from the number of columnar portions CL within the region K in FIG. 22 (ten) by the area of the region K.

Note that the length of the region N in the X-direction and the length of the region K in the X-direction change depending on the angle θ between the grids. As the angle between the grids is larger, the length of each region in the X-direction is smaller.

In comparison between the curves C9a to C9d and the curves C10a to C10d, in a range of the angle θ between the grids not less than 30 degrees and not more than 60 degrees, it is possible to increase the density of formation of columnar portions CL by the disposition of the columnar portions CL of the embodiment. Therefore, in the embodiment, it is possible to dispose the columnar portions CL so that the number of columnar portions CL per unit area of the electrode layer WL may be larger. Thereby, it is possible to suppress reduction in density of formation of the memory cells MC in the semiconductor memory device 1.

As below, a variation of the semiconductor memory device 1 will be described.

Sixth Embodiment

Figure 27:
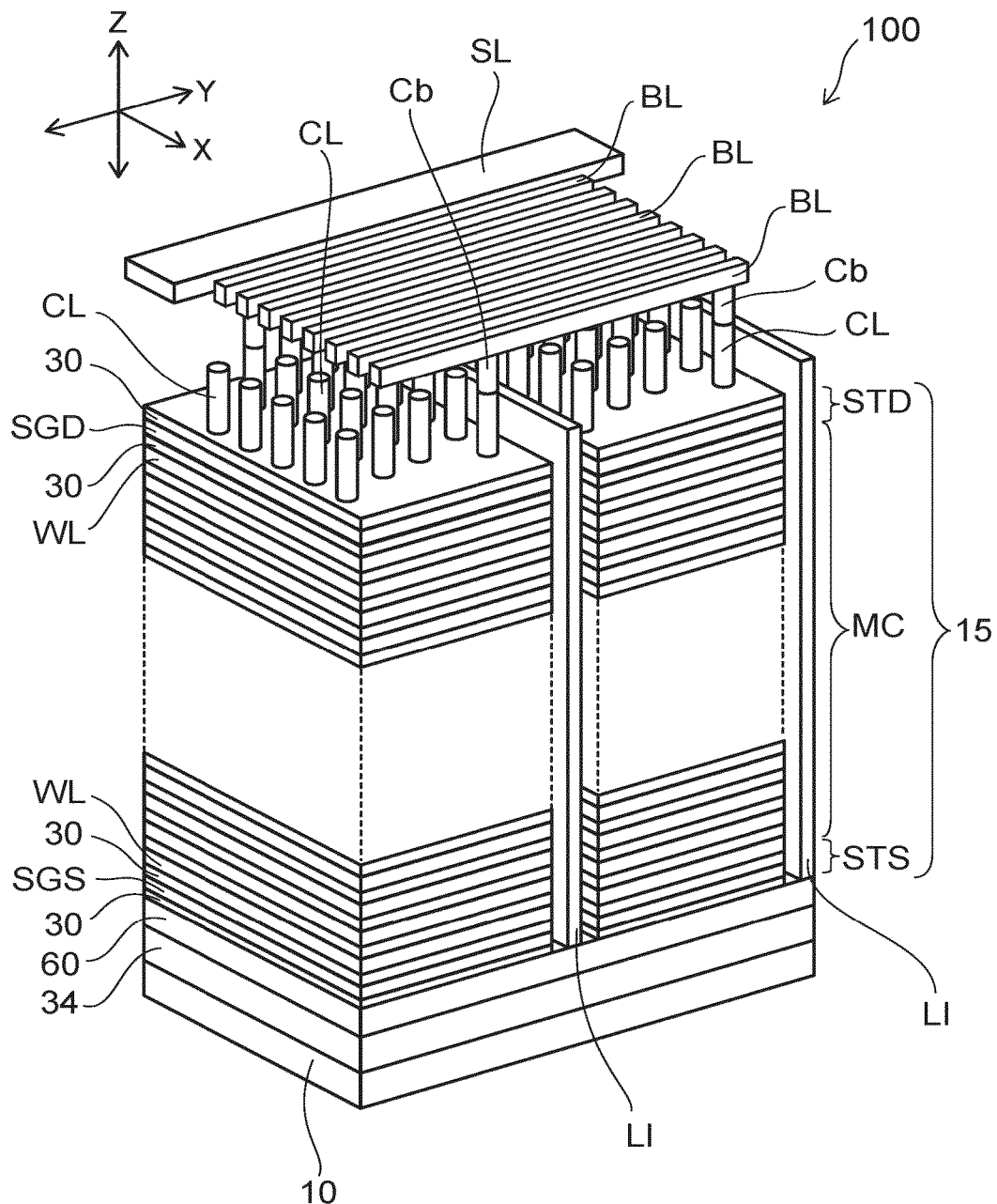
FIG. 27 is a schematic perspective view of a semiconductor memory device of a sixth embodiment.

FIG. 27 is a schematic perspective view of a semiconductor memory device of a sixth embodiment.

FIG. 27 is a perspective view corresponding to FIG. 1 and shows a semiconductor memory device 100 according to the variation.

As shown in FIG. 27, the semiconductor memory device 100 further has a conductive layer 60 and an insulating layer 34 compared to the semiconductor memory device 1. The insulating layer 34 is provided on the substrate 10. Within the insulating layer 34, interconnect layers and circuit elements of transistors or the like (not shown) are provided. The conductive layer 60 is provided on the insulating layer 34. The insulating layer 30 is provided on the conductive layer 60. The configuration upper than the insulating layer 30 is the same as e.g. that of the semiconductor memory device 1. Note that the interconnect portion LI is electrically connected to the columnar portions CL via the conductive layer 60.

Seventh Embodiment

Figure 28:
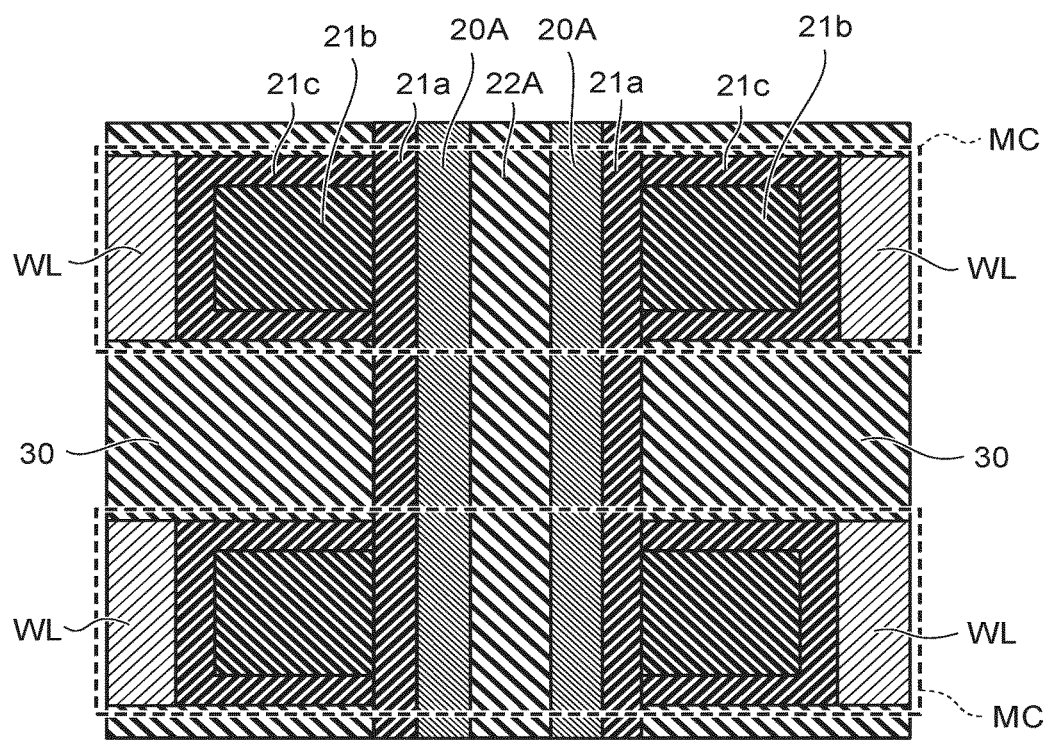
FIG. 28 is a schematic cross-sectional view of a part of a semiconductor memory device according to a seventh embodiment.

FIG. 28 is a schematic cross-sectional view of a part of a semiconductor memory device according to a seventh embodiment.

FIG. 28 is a cross-sectional view corresponding to FIG. 3 and illustrates a part of a semiconductor memory device 110 according to a variation.

As shown in FIG. 28, plural charge storage layers 21b may be provided in each memory cell MC (that is, each electrode layer WL). Each of the charge storage layers 21b is stacked via the insulating layer 30. For example, the charge storage layers 21b may contain a semiconductor material such as silicon.

Plural block insulating layers 21c may be provided as the charge storage layers 21b. Each of block insulating layers 21c is provided between each electrode layer WL and each charge storage layer 21b and between the insulating layer 30 and each charge storage layer 21b.

As below, a method for manufacturing the semiconductor memory device of the embodiment will be described.

First, a stacked body in which the insulating layers 30 and sacrifice layers are alternately stacked is formed on the substrate 10, and then, a plurality of memory holes piercing the stacked body to reach the substrate 10 are formed. The plurality of memory holes are formed by e.g. RIE. For instance, the plurality of memory holes are formed using a predetermined mask. At least part of the plurality of memory holes are disposed in a pattern in which a plurality of equilateral triangles are combined in a staggered manner in the X-direction. Part of the plurality of memory holes are not disposed along the X-direction.

Then, a memory film 21A, a channel body 20A, and a core insulating portion 22A are sequentially formed within a memory hole. Thereby, a columnar portion CL is formed.

Then, a slit is formed in the stacked body, the sacrifice layers are removed via the slit, and then, the conductive layers are formed within a cavity formed by removal of the sacrifice layers. Thereby, a stacked body 15 having a plurality of electrode layers WL, the plurality of insulating layers 30, a source-side select gate SGS, and a drain-side select gate SGD is formed.

Then, an insulating layer 40 is formed within the slit, and then, a conductive film is formed. Thereby, the interconnect portion LI is formed. For instance, a plurality of columnar portions CL are provided between the interconnect portions LI. At least part of the plurality of columnar portions CL are disposed in a pattern in which a plurality of equilateral triangles are combined in a staggered manner in the X-direction. Part of the plurality of memory holes are not disposed along the X-direction.

Then, contact portions Cb and V1 are formed on the columnar portions CL, and then, bit lines BL are formed.

In this manner, the semiconductor memory device 1 of the embodiment is manufactured.

According to the above described embodiments, it is possible to realize a semiconductor memory device in which reduction in density of formation of memory cells is suppressed and occurrence of a defect in memory operation is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a substrate;
a stacked body provided on the substrate and including a plurality of electrode layers respectively separately stacked in a stacking direction;
a plurality of columnar portions provided within the stacked body and extending in the stacking direction; and
a first interconnect provided on the plurality of columnar portions and extending in a first direction, the first direction being parallel to a surface of the substrate and perpendicular to the stacking direction, wherein
when an imaginary first straight line extending in a second direction is set, the second direction being parallel to the surface of the substrate and perpendicular to the stacking direction, the second direction crossing both the first direction and a third direction, the third direction being parallel to the surface of the substrate and perpendicular to both the stacking direction and the first direction, the plurality of columnar portions being divided into:
first sets of n (n is an integer number not less than 3 and not more than 32) columnar portions disposed adjacently along the imaginary first straight line having center axes alternately disposed on both sides of the imaginary first straight line along the second direction, and
second sets of n columnar portions disposed adjacently along an imaginary second straight line parallel to the imaginary first straight line having center axes alternately disposed on both sides of the imaginary second straight line along the second direction, the second sets having position relationships of inversion with respect to the first sets, and
the first sets and the second sets being alternately arranged with respect to one another.

2. The device according to claim 1, wherein
the plurality of columnar portions have a first columnar portion, a second columnar portion, and a third columnar portion disposed in a triangle pattern, and a fourth columnar portion, a fifth columnar portion, and a sixth columnar portion disposed in a triangle pattern,
a first triangle formed by imaginary straight lines connecting a center of the first columnar portion, a center of the second columnar portion, and a center of the third columnar portion is an inversion with respect to a second triangle formed by imaginary straight lines connecting a center of the fourth columnar portion, a center of the fifth columnar portion, and a center of the sixth columnar portion, and
when an imaginary third straight line connecting the centers of the first columnar portion and the fourth columnar portion is set, an imaginary fourth straight line connecting the centers the second columnar portion and the third columnar portion is set, and an imaginary fifth straight line connecting the centers of the fifth columnar portion and the sixth columnar portion is set:
the imaginary fourth straight line and the imaginary fifth straight line are parallel with each other and extend in the third direction crossing the first direction and the second direction, and
the imaginary third straight line does not extend in the third direction.

3. The device according to claim 2, wherein
a distance between the first columnar portion and the fourth columnar portion is longer than a distance between the first columnar portion and the fifth columnar portion and a distance between the second columnar portion and the fourth columnar portion, and the distance between the first columnar portion and the fourth columnar portion is shorter than a distance between the third columnar portion and the sixth columnar portion.

4. The device according to claim 3, wherein the first columnar portion and the fifth columnar portion, the second columnar portion and the fourth columnar portion, and the third columnar portion and the sixth columnar portion are respectively disposed along a fourth direction.

5. The device according to claim 4, wherein a first angle formed by the third direction and the fourth direction is not less than 30 degrees and not more than 60 degrees.

6. The device according to claim 1, wherein the plurality of columnar portions are disposed in a first region and a second region provided adjacent to the first region in the third direction crossing both the first direction and the second direction, the first interconnects in the same numbers extend into the first region and the second region, and the columnar portions within the first region are disposed in a different disposition of the columnar portions than those within the second region.

7. The device according to claim 6, wherein the columnar portions within the first region are disposed to be an inversion of the disposition of the columnar portions within the second region.

8. The device according to claim 6, wherein the plurality of columnar portions are disposed by alternate repetition of the disposition of the columnar portions within the first region and the disposition of the columnar portions within the second region.

9. A semiconductor memory device comprising:
a substrate;
a stacked body provided on the substrate and including a plurality of electrode layers respectively separately stacked;
a plurality of columnar portions provided within the stacked body and extending in a stacking direction of the stacked body; and
an interconnect portion provided within the stacked body and extending in a first direction, wherein
at least part of the plurality of columnar portions are disposed in a first pattern in which a plurality of equilateral triangles are combined in a staggered manner in the first direction,
a first pair of columnar portions of two equilateral triangles disposed in the first pattern have centers of the columnar portions connected by an imaginary first straight line not extending in the first direction,
a second pair of columnar portions of the two equilateral triangles disposed in the first pattern have centers of the columnar portions connected by an imaginary second straight line extending in the first direction,
a third pair of columnar portions of the two equilateral triangles disposed in the first pattern have centers of the columnar portions connected by an imaginary third straight line extending in the first direction,
the plurality of columnar portions have a first columnar portion, a second columnar portion, and a third columnar portion, a fourth columnar portion, a fifth columnar portion, and a sixth columnar portion disposed in the first pattern,
a first triangle formed by imaginary straight lines connecting a center of the first columnar portion, a center of the second columnar portion, and a center of the third columnar portion is an inversion with respect to a second triangle formed by imaginary straight lines connecting a center of the fourth columnar portion, a center of the fifth columnar portion, and a center of the sixth columnar portion, one of the first columnar portion, the second columnar portion, and the third columnar portion and one of the fourth columnar portion, the fifth columnar portion, and the sixth columnar portion are connected by the imaginary first straight line, a distance between the first columnar portion and the fourth columnar portion is longer than a distance between the first columnar portion and the fifth columnar portion and a distance between the second columnar portion and the fourth columnar portion, and the distance between the first columnar portion and the fourth columnar portion is shorter than a distance between the third columnar portion and the sixth columnar portion.

10. The device according to claim 9, wherein the first columnar portion and the fifth columnar portion, the second columnar portion and the fourth columnar portion, and the third columnar portion and the sixth columnar portion are respectively disposed along a second direction.

11. The device according to claim 10, wherein a first angle formed by the first direction and the second direction is not less than 30 degrees and not more than 60 degrees.

12. The device according to claim 9, further comprising a first interconnect provided on the plurality of columnar portions and extending in a third direction crossing the first direction.

13. A semiconductor memory device comprising:
a substrate;
a stacked body provided on the substrate and including a plurality of electrode layers respectively separately stacked;
a plurality of columnar portions provided within the stacked body and extending in a stacking direction of the stacked body; and
a first interconnect provided on the plurality of columnar portions and extending in a first direction, wherein
the plurality of columnar portions are provided along a plurality of rows,
the plurality of rows includes a first row, a second row adjacent to the first row in the first direction, and a third row adjacent to the second row in the first direction,
the columnar portions provided in the first row have centers which are all connected by an imaginary first straight line extending in a second direction crossing the first direction,
the columnar portions provided in the second row include columnar portions which have centers which are connected by an imaginary second straight line extending in the second direction and columnar portions overlapping the imaginary second straight line which have centers which are not connected by the imaginary second straight line, and
the columnar portions provided in the third row have centers which are all connected by an imaginary third straight line extending in the second direction.

14. The device according to claim 13, wherein the plurality of columnar portions are disposed in a pattern in which a plurality of triangles are combined in a staggered manner in the second direction.

15. The device according to claim 13, wherein
the plurality of rows have a fourth row adjacent to the third row in the first direction, and the columnar portions provided in the fourth row include columnar portions which have centers which are connected by an imaginary fourth straight line extending in the second direction and columnar portions overlapping the imaginary fourth straight line which have centers which are not connected by the imaginary fourth straight line.

16. The device according to claim 15, wherein
the plurality of rows have a fifth row adjacent to the fourth row in the first direction, and
the columnar portions provided in the fifth row have centers which are all connected by an imaginary fifth straight line extending in the second direction.

17. The device according to claim 16, wherein the plurality of columnar portions are disposed in a pattern in which a plurality of triangles is combined in a staggered manner in the second direction.

18. The device according to claim 16, wherein
the plurality of rows have a sixth row adjacent to the fifth row in the first direction, and
the columnar portions provided in the sixth row include columnar portion which have centers which are connected by an imaginary sixth straight line extending in the second direction and columnar portions overlapping the imaginary sixth straight line which have centers which are not connected by the imaginary sixth straight line.

\* \* \* \* \*